(12) United States Patent
Lee et al.

(10) Patent No.: US 12,433,099 B2
(45) Date of Patent: Sep. 30, 2025

(54) DISPLAY PANEL AND DISPLAY APPARATUS INCLUDING THE SAME

(71) Applicant: Samsung Display Co., Ltd., Yongin-si (KR)

(72) Inventors: Wonse Lee, Yongin-si (KR); Jieun Lee, Yongin-si (KR); Donghyeon Jang, Yongin-si (KR); Yujin Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 440 days.

(21) Appl. No.: 18/102,571

(22) Filed: Jan. 27, 2023

(65) Prior Publication Data

US 2023/0371307 A1 Nov. 16, 2023

(30) Foreign Application Priority Data

May 12, 2022 (KR) .................. 10-2022-0058594

(51) Int. Cl.
*H10K 59/121* (2023.01)
*G09G 3/3233* (2016.01)
*H10K 59/131* (2023.01)
*H10K 59/65* (2023.01)

(52) U.S. Cl.
CPC ......... *H10K 59/121* (2023.02); *G09G 3/3233* (2013.01); *H10K 59/131* (2023.02); *H10K 59/65* (2023.02); *G09G 2300/0426* (2013.01); *G09G 2330/021* (2013.01); *G09G 2354/00* (2013.01)

(58) Field of Classification Search
CPC .............. H10K 59/351; H10K 59/123; H10K 59/80515; H10K 59/814; H10K 59/121; H10K 59/131; H10K 59/65; G09G 3/3233; G09G 2300/042; G09G 2330/021; G09G 2354/00
See application file for complete search history.

(56) References Cited

U.S. PATENT DOCUMENTS

| | | | |
|---|---|---|---|
| 10,490,124 B2 | 11/2019 | Xie | |
| 10,734,415 B1 | 8/2020 | Liu et al. | |
| 2023/0215336 A1* | 7/2023 | Han | .......... G09G 3/2096 345/691 |
| 2024/0381718 A1* | 11/2024 | Cheng | .......... G09G 3/3266 |
| 2024/0412687 A1* | 12/2024 | Kusunoki | .......... G09F 9/30 |

FOREIGN PATENT DOCUMENTS

| | | |
|---|---|---|
| CN | 111708199 A | 9/2020 |
| CN | 109713024 B | 1/2021 |
| CN | 112271203 A | 1/2021 |

\* cited by examiner

*Primary Examiner* — Anne M Hines
(74) *Attorney, Agent, or Firm* — Womble Bond Dickinson (US) LLP

(57) ABSTRACT

A display panel includes a first display area having a plurality of first display elements, a second display area having a plurality of second display elements, and a third display area between the first display area and the second display area, wherein the third display area includes a first sub display area adjacent to the second display area in a first direction, and a second sub display area adjacent to the second display area in a second direction, the first sub display area comprises a bypass area, some data lines pass across the first sub display area and the second sub display area, and change their extension direction in the bypass area.

22 Claims, 20 Drawing Sheets

DISPLAY PANEL AND DISPLAY APPARATUS INCLUDING THE SAME

CROSS-REFERENCE TO RELATED APPLICATION

The present application claims priority to and the benefit of Korean Patent Application No. 10-2022-0058594, filed on May 12, 2022, in the Korean Intellectual Property Office, the entire disclosure of which is incorporated herein by reference.

BACKGROUND

1. Field

Aspects of one or more embodiments relate to a display panel and a display apparatus including the display panel.

2. Description of the Related Art

The various uses and applications of display apparatuses has steadily diversified and expanded over time. Also, as the thicknesses and weights of the display devices have decreased, the range of possible applications and use cases of display devices has increased. As display devices are used for various purposes, various methods may be used to design the shapes of the display devices, and the number of functions, which may be connected to or associated with the display devices, has increased.

The above information disclosed in this Background section is only for enhancement of understanding of the background and therefore the information discussed in this Background section does not necessarily constitute prior art.

SUMMARY

Aspects of one or more embodiments include a display panel with an extended display area at which images may be displayed even in an area in which a component that is an electronic element is arranged, and a display apparatus including the display panel. However, these problems are merely examples, and the scope of embodiments according to the present disclosure is not limited thereto.

Additional aspects will be set forth in part in the description which follows and, in part, will be apparent from the description, or may be learned by practice of the presented embodiments of the disclosure.

According to one or more embodiments, a display panel may include a substrate including a first display area in which a plurality of first display elements are arranged, a second display area in which a plurality of second display elements are arranged, and a third display area between the first display area and the second display area, a plurality of first pixel circuits arranged in the first display area and connected to the plurality of first display elements, a plurality of second pixel circuits arranged in the third display area and connected to the plurality of second display elements, and a plurality of first data lines connected to the plurality of first pixel circuits of the first display area and the plurality of second pixel circuits of the third display area, wherein the third display area may include a first sub display area adjacent to the second display area in a first direction, and a second sub display area adjacent to the second display area in a second direction, the first sub display area may include a bypass area, and the plurality of first data lines pass across the first sub display area and the second sub display area, and an extension direction thereof may change in the bypass area.

According to one or more embodiments, the bypass area may extend along the first sub display area in the second direction, and may be adjacent to the second sub display area and the second display area.

According to one or more embodiments, the display panel may further include a plurality of third display elements and a plurality of third pixel circuits connected to the plurality of third display elements, arranged in the first sub display area of the third display area, a plurality of fourth display elements and a plurality of fourth pixel circuits connected to the plurality of fourth display elements, arranged in the second sub display area of the third display area, and a plurality of second data lines which are connected to the first pixel circuits of the first display area and the fourth pixel circuits of the second sub display area, and of which an extension direction changes in the bypass area of the first sub display area.

According to one or more embodiments, each of the first data lines and the second data lines may be connected to the first pixel circuits and the third pixel circuits of the first sub display area, in a same column.

According to one or more embodiments, a size of the third pixel circuits in the first direction may be less than a size of the first pixel circuits in the first direction.

According to one or more embodiments, each of the third display elements may overlap a portion of each of the third pixel circuits to which the third display element is connected and a portion of the bypass area.

According to one or more embodiments, at least one of the first data lines and at least one of the second data lines may cross each other in the bypass area.

According to one or more embodiments, a portion of each of the first data lines and a portion of each of the second data lines that cross each other in the bypass area may be arranged on different layers from each other.

According to one or more embodiments, regarding one of the first data line and the second data line crossing each other in the bypass area, a portion arranged in the first sub display area and a portion arranged in the second sub display area may be electrically connected to each other.

According to one or more embodiments, one of the first data line and the second data line crossing each other in the bypass area may include a first portion arranged in the first sub display area and a second portion arranged in the second sub display area, and the first portion may be electrically connected to the second portion in the bypass area.

According to one or more embodiments, one of the first data line and the second data line crossing each other in the bypass area may include a first portion arranged in the first sub display area, a second portion arranged in the second sub display area, and a third portion arranged in the bypass area and connecting the first portion and the second portion.

According to one or more embodiments, the display panel may include a substrate comprising a first display area in which a plurality of first display elements are arranged, a second display area in which a plurality of second display elements are arranged, and a third display area between the first display area and the second display area, a plurality of first pixel circuits arranged in the first display area and connected to the plurality of first display elements, a plurality of second pixel circuits arranged in the third display area and connected to the plurality of second display elements, and a plurality of first data lines connected to the plurality of first pixel circuits of the first display area and the plurality of second pixel circuits of the third display area, wherein the third display area comprises a pair of first sub display areas arranged to be apart from each other in a first direction with the second display area therebetween, and a pair of second sub display areas arranged to be apart from each other in a second direction with the second display area therebetween, each of the pair of first sub display areas comprises a bypass area, and the first data lines pass across one of the first sub display areas and the second sub display areas, and an extension direction thereof changes in the bypass area.

According to one or more embodiments, the display panel may further include a plurality of third display elements and a plurality of third pixel circuits connected to the third display elements, arranged in the first sub display areas of the third display area, a plurality of fourth display elements and a plurality of fourth pixel circuits connected to the fourth display elements, arranged in the second sub display areas of the third display area, and a plurality of second data lines which are connected to the first pixel circuits of the first display area and the fourth pixel circuits of each of the second sub display areas, and of which an extension direction changes in the bypass area of each of the first sub display areas, wherein each of the first data lines and the second data lines may be connected to the first pixel circuits and the third pixel circuits of the first sub display area, in a same column.

According to one or more embodiments, a size of the third pixel circuits in the first direction may be less than a size of the first pixel circuits in the first direction.

According to one or more embodiments, at least one of the first data lines and at least one of the second data lines may cross each other in the bypass area.

According to one or more embodiments, a portion of each of the first data lines and a portion of each of the second data lines that cross each other in the bypass area may be arranged on different layers from each other.

According to one or more embodiments, one of the first data line and the second data line crossing each other in the bypass area may include a first portion and a second portion arranged in each of the pair of first sub display areas, and a connection portion arranged in the second sub display area, and the first portion and the second portion may be electrically connected to each other by the connection portion in the bypass area.

According to one or more embodiments, one of the first data line and the second data line crossing each other in the bypass area may include a first portion and a second portion arranged in each of the pair of first sub display areas, a third portion arranged in the second sub display area, and a first connection portion and a second connection portion arranged in the bypass area of each of the pair of first sub display areas, and the first connection portion may electrically connect the first portion to the third portion, and the second connection portion may electrically connect the second portion to the third portion.

According to one or more embodiments, a display apparatus may include a display panel including a first display area in which a plurality of first display elements are arranged, a second display area in which a plurality of second display elements are arranged, and a third display area between the first display area and the second display area, a component arranged to correspond to the second display area under the display panel, wherein the display panel may further include a plurality of first pixel circuits arranged in the first display area and connected to the first display elements, a plurality of second pixel circuits arranged in the third display area and connected to the second display elements, and a plurality of first data lines connected to the first pixel circuits of the first display area and the second pixel circuits of the third display area, wherein the third display area may include a pair of first sub display areas arranged to be apart from each other in a first direction with the second display area therebetween, and a pair of second sub display areas arranged to be apart from each other in a second direction with the second display area therebetween, each of the pair of the first sub display area may include a bypass area, and the first data lines may pass across one of the first sub display areas and the second sub display areas, and an extension direction thereof may change in the bypass area.

According to one or more embodiments, a size of the third pixel circuits in the first direction may be less than a size of the first pixel circuits in the first direction.

According to one or more embodiments, at least one of the first data lines and at least one of the second data lines may cross each other in the bypass area, one of the first data line and the second data line crossing each other in the bypass area may include a first portion and a second portion arranged in the pair of first sub display areas and a connection portion arranged in the second sub display area, and the first portion and the second portion may be electrically connected to each other by the connection portion in the bypass area.

According to one or more embodiments, at least one of the first data lines and at least one of the second data lines may cross each other in the bypass area, one of the first data line and the second data line crossing each other in the bypass area may include a first portion and a second portion arranged in each of the pair of first sub display areas, a third portion arranged in the second sub display area, and a first connection portion and a second connection portion arranged in the bypass area of each of the pair of first sub display areas, and the first connection portion may electrically connect the first portion to the third portion, and the second connection portion may electrically connect the second portion to the third portion.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
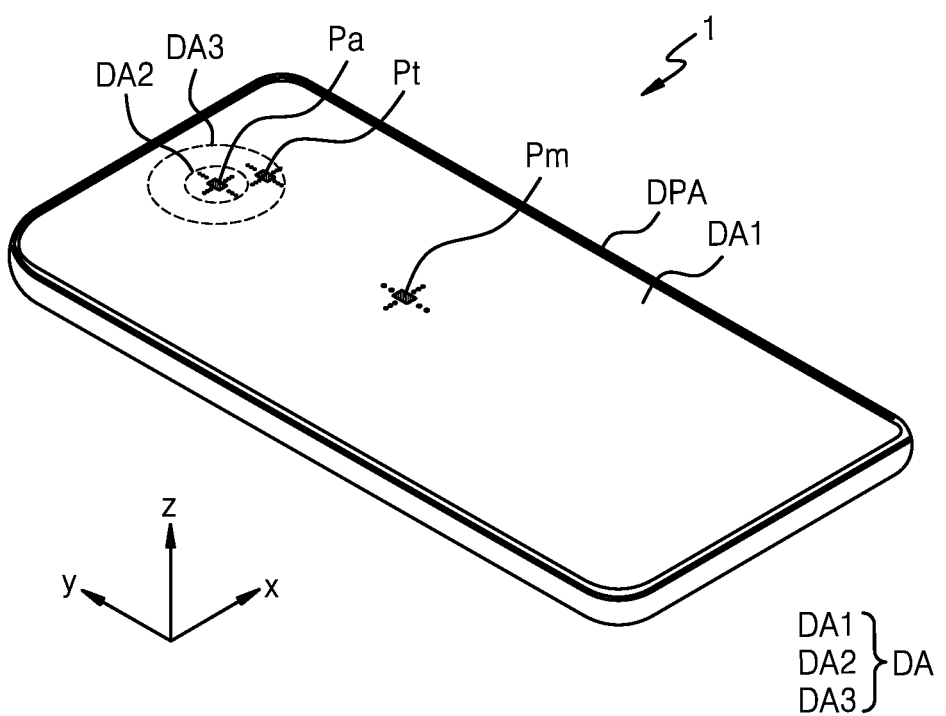
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in detail. The effects and features of the disclosure and the accomplishing methods thereof will become apparent from the embodiments described below in detail with reference to the accompanying drawings. However, embodiments according to the present disclosure are not limited to the embodiments described below and may be embodied in various modes.

Hereinafter, embodiments will be described in detail with reference to the accompanying drawings, and in the following description, like reference numerals will denote like elements and redundant descriptions thereof will be omitted for conciseness.

It will be understood that, when a layer, film, region, or plate is referred to as being "on" another layer, film, region, or plate, it can be directly or indirectly on the other layer, film, region, or plate. That is, for example, intervening layers, films, regions, or plates may be present. In the drawings, sizes of elements in the drawings may be exaggerated or reduced for convenience of explanation. In other words, because sizes and thicknesses of elements in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x axis, the y axis, and the z axis may be perpendicular to one another or may represent different directions that are not perpendicular to one another.

FIG. 1 is a perspective view of a display apparatus according to some embodiments.

Referring to FIG. 1, a display apparatus 1 may include a display area DA and a peripheral area DPA outside the display area DA.

The display area DA may include a first display area DA1, a second display area DA2, and a third display area DA3. The first display area DA1 may be arranged (disposed) to at least partially surround the second display area DA2 and the third display area DA3. A plurality of pixels may be arranged in the first display area DA1, the second display area DA2, and the third display area DA3. The first display area DA1 may be an area at which a main image is displayed, and the second display area DA2 and the third display area DA3 may be areas at which an auxiliary image is displayed. The auxiliary image may provide one full image, or a single collective image, together with the main image, and/or the auxiliary image may be an image that is independent from the main image (e.g., not part of a single collective image in combination with the image displayed at the first display area DA1).

A plurality of first pixels Pm may be arranged in the first display area DA1, a plurality of second pixels Pa may be arranged in the second display area DA2, and a plurality of third pixels Pt may be arranged in the third display area DA3. The first pixel Pm, the second pixel Pa, and the third pixel Pt may include display elements displaying red color, green color, or blue color, respectively.

The second display area DA2 may be an area that overlaps a component. In the second display area DA2, a light transmittance of the display apparatus 1 may be 10% or more, for example, 25% or more, 40% or more, 50% or more, 85% or more, or 90% or more. According to some embodiments, the transmittance of light or sound of the display apparatus 1 in the second display area DA2 may be greater than or equal to the transmittance of light or sound of the display apparatus 1 in the second display area DA2 and the third display area DA3.

At least one second display area DA2 may be provided in the display apparatus 1. For example, the display apparatus 1 may be provided with one second display area DA2 or a plurality of second display areas DA2. When the display apparatus 1 is provided with a plurality of second display areas DA2, the display apparatus 1 may be provided with a plurality of third display areas DA3 that surround each of the plurality of second display areas DA2. Shapes and sizes of the plurality of second display areas DA2 may be different from each other. When viewed from a direction approximately perpendicular to the upper surface of the display apparatus 1 (e.g., in a plan view, or a direction normal with respect to a plane defined by the x-direction and the y-direction, or normal with respect to a display surface of the display apparatus 1), the second display area DA2 may have various shapes, such as a circular shape, an oval shape, a polygonal shape, such as a quadrilateral or the like, a star shape, or a diamond shape. In addition, in FIG. 1, when viewed from a direction approximately perpendicular to the upper surface of the display apparatus 1 (e.g., in a plan view), the second display area DA2 is arranged in the center of the upper side (in +y direction) of the first display area DA1 having an approximately quadrilateral shape. However, the second display area DA2 may be arranged at one side, for example, the upper right side or the upper left side, of the first display area DA1 that is a quadrilateral.

Figure 2:
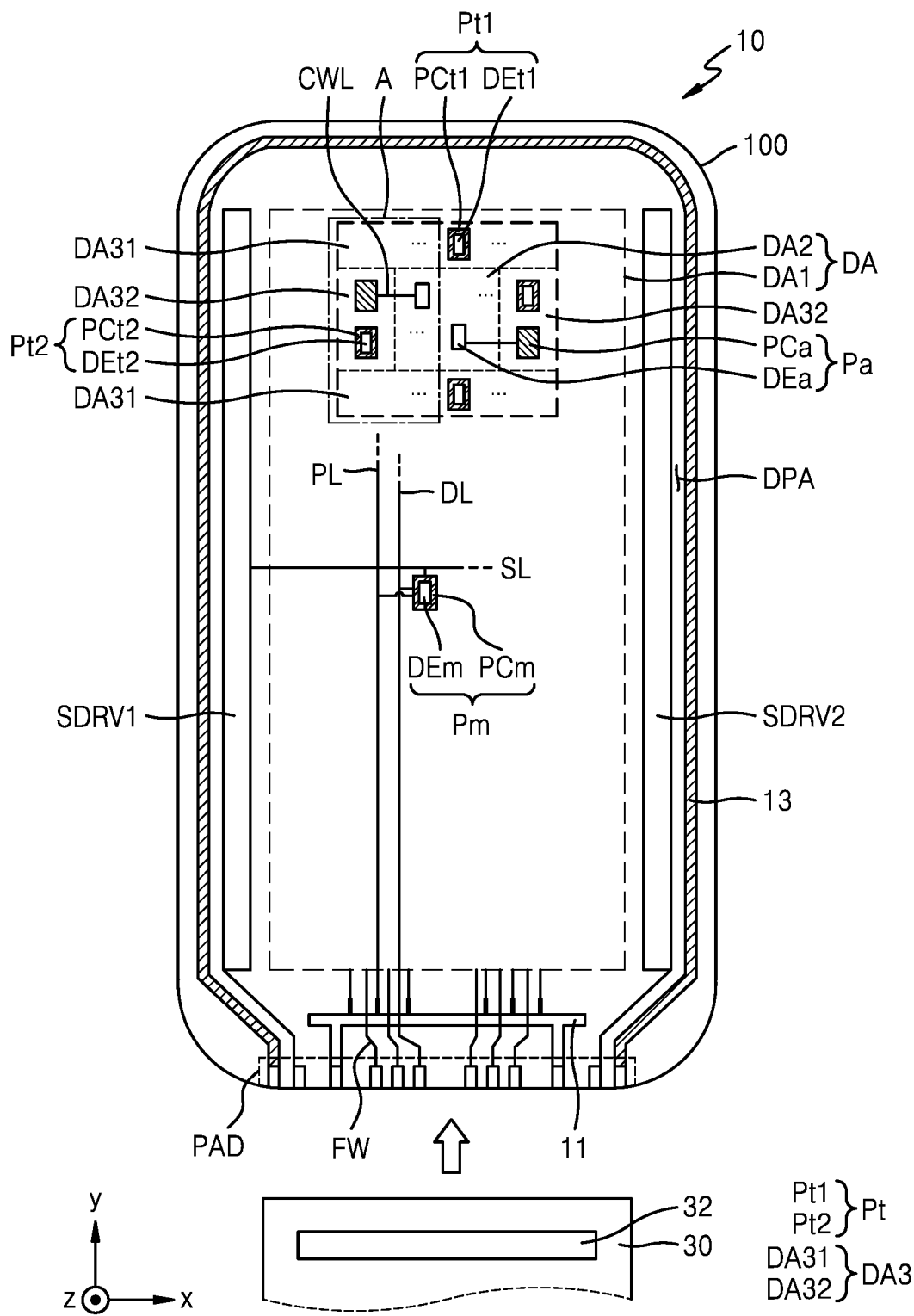
FIG. 2 is a plan view schematically illustrating a display panel that may be included in the display apparatus in FIG. 1, according to an embodiment.
Figure 3:
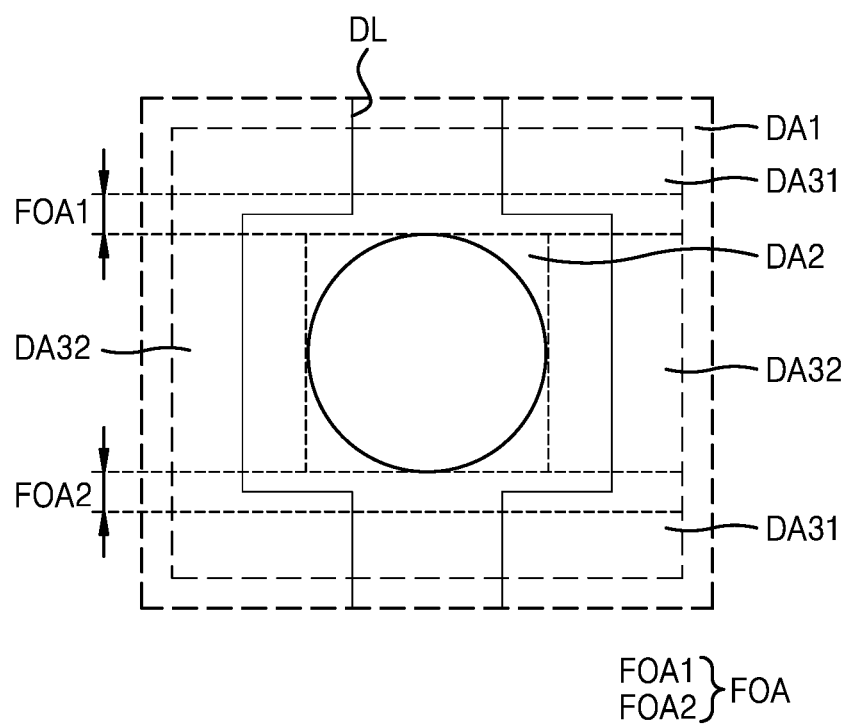
FIG. 3, which is a plan view showing a portion of the display panel according to some embodiments, shows signal lines located in the third display area.

FIG. 2 is a plan view schematically illustrating a display panel that may be included in the display apparatus in FIG. 1, according to some embodiments; FIG. 3, which is a plan view showing a portion of the display panel according to some embodiments, shows signal lines located in the third display area.

Referring to FIG. 2, a display panel DP may include a substrate 100. The substrate 100 may include the display area DA and the peripheral area DPA surrounding the display area DA. The display area DA may include a first display area DA1, a second display area DA2, and a third display area DA3.

A plurality of first pixels Pm may be arranged in the first display area DA1. Each of the first pixels Pm may include a display element DEm, such as an organic light-emitting diode (OLED). A first display element DEm of the first pixel Pm may be electrically connected to a first pixel circuit PCm. The first display element DEm of the first pixel Pm may be arranged adjacent to the first pixel circuit PCm or to overlap at least a portion of the first pixel circuit PCm. The first display element DEm of the first pixel Pm may emit, for example, red light, green light, blue light, or white light.

Second display elements DEa of the plurality of second pixels Pa may be arranged in the second display area DA2. The second display element DEa may be an OLED. A second pixel circuit PCa of the second pixel Pa that drives the second display element DEa may be arranged in the third display area DA3. The second pixel circuit PCa and the second display element DEa may be electrically connected to each other by a connection line CWL. The second display element DEa of the second pixel Pa may emit, for example, red light, green light, blue light, or white light.

The third display area DA3 may surround the second display area DA2. As shown in FIG. 3, the third display area DA3 may be an area in which some data lines DL of the data lines DL passing across the first display area DA1 bypass the second display area DA2. Some scan lines SL among the scan lines SL passing across the first display area DA1 may be disconnected with the second display area DA2 therebetween. In this case, the scan line SL arranged on the left side of the second display area DA2 may receive scan signals from a first scan driving circuit SDRV1, and the scan line SL arranged on the right side of the second display area DA2 may receive scan signals from a second scan driving circuit SDRV2.

The third display area DA3 may include a pair of first sub display areas DA31 that are apart from each other in a y direction with the second display area DA2 therebetween, and a pair of second sub display areas DA32 that are apart from each other in an x-direction with the second display area DA2 therebetween. That is, the third display area DA3 may include the first sub display areas DA31 arranged on the upper and lower sides of the second display area DA2 and the second sub display areas DA32 arranged on left and right sides of the second display area DA2. Each of the first sub display areas DA31 may be between the first display area DA1 and the second sub display area DA32 and between the first display area DA1 and the second display area DA2, and may be adjacent to the first display area DA1 and extend in an x direction. Each of the second sub display areas DA32 may be between the first display area DA1 and the second display area DA2, and may be adjacent to the first display area DA1 and extend in a y-direction.

Each of the first sub display areas DA31 may include a bypass area FOA. The bypass area FOA may include a first bypass area FOA1 in the upper first sub display area DA31 and a second bypass area FOA2 in the lower first sub display area DA31. The first bypass area FOA1 and the second bypass area FOA2 may each extend in the x direction along the first sub display area DA31. The first bypass area FOA1 may include, in the upper first sub display area DA31, an area extending in the x direction along a boundary between the upper first sub display area DA31 and the second sub display area DA32 and an area extending in the x-direction along a boundary between the upper first sub display area DA31 and the second display area DA2. The second bypass area FOA2 may include, in the lower first sub display area DA31, an area extending in the x-direction along a boundary between the lower first sub display area DA31 and the second sub display area DA32 and an area extending in the x direction along a boundary between the lower first sub display area DA31 and the second display area DA2. The first bypass area FOA1 and the second bypass area FOA2 may each be an area adjacent to the left and right second sub display areas DA32 and extending in the y direction from the second sub display areas DA32.

Some data lines DL may pass across the upper and lower first sub display area DA31 and the left second sub display area DA32, and the extension direction thereof may change in the first bypass area FOA1 and the second bypass area FOA2. Some data lines DL may pass across the upper and lower first sub display area DA31 and the right second sub display area DA32, and the extension direction thereof may change in the first bypass area FOA1 and the second bypass area FOA2.

A plurality of third pixels Pt1 may be arranged in the upper and lower first sub display areas DA31. Each of the third pixels Pt1 may include a third display element DEt1, such as an OLED. The third display element DEt1 of the third pixel Pt1 may be electrically connected to a third pixel circuit PCt1. The third display element DEt1 of the third pixel Pt1 may be arranged adjacent to the third pixel circuit PCt1 or to overlap at least a portion of the third pixel circuit PCt1. The third display element DEt1 of the third pixel Pt1 may emit, for example, red light, green light, blue light, or white light.

A plurality of fourth pixels Pt2 may be arranged in the left and right second sub display areas DA32. Each of the fourth pixels Pt2 may include a fourth display element DEt2, such as an OLED. The fourth display element DEt2 of the fourth pixel Pt2 may be electrically connected to a fourth pixel circuit PCt2. The fourth display element DEt2 of the fourth pixel Pt2 may be arranged adjacent to the fourth pixel circuit PCt2 or to overlap at least a portion of the fourth pixel circuit PCt1. The fourth display element DEt2 of the fourth pixel Pt2 may emit, for example, red light, green light, blue light, or white light. In addition, the second pixel circuits PCa of the second pixels Pa may be arranged in the second sub display area DA32.

According to some embodiments, the first pixel circuit PCm, the second pixel circuit PCa, the third pixel circuit PCt1, and the fourth pixel circuit PCt2 may be identical to each other. However, embodiments according to the present disclosure are not limited thereto. The first pixel circuit PCm, the second pixel circuit PCa, the third pixel circuit PCt1, and the fourth pixel circuit PCt2 may be different from each other, and various modifications are possible.

According to some embodiments, the sizes of the first pixel circuit PCm, the second pixel circuit PCa, the third pixel circuit PCt1, and the first pixel circuit PCt2, for example, the areas of the regions in which the first pixel circuit PCm, the second pixel circuit PCa, the third pixel circuit PCt1, and the fourth pixel circuit PCt2 are arranged, may be different from each other.

The first pixel circuit PCm, the second pixel circuit PCa, the third pixel circuit PCt1, and the fourth pixel circuit PCt2 may be electrically connected to outer circuits arranged in the peripheral area DPA. The first scan driving circuit SDRV1, the second scan driving circuit SDRV2, a terminal unit PAD, a driving voltage supply line 11, and a common voltage supply line 13 may be arranged in the peripheral area DPA.

The first scan driving circuit SDRV1 and the second scan driving circuit SDRV2 may apply the scan signals to the first pixel circuits PCm, the second pixel circuits PCa, the third pixel circuits PCt1, and the fourth pixel circuits PCt2 through the scan lines SL. The second scan driving circuit SDRV2 may be located on the opposite side of the first scan driving circuit SDRV1 with the first display area DA1 therebetween and may be substantially parallel to the first scan driving circuit SDRV1. Some of the first pixel circuits PCm, the second pixel circuits PCa, the third pixel circuits PCt1, and the fourth pixel circuits PCt2 may be electrically connected to the first scan driving circuit SDRV1, and the remaining pixel circuits may be electrically connected to the second scan driving circuit SDRV2.

The terminal unit PAD may be arranged at one side of the substrate 100. The terminal unit PAD may not be covered by an insulating layer and may be exposed, and may be electrically connected to a display circuit board 30. A display driver 32 may be arranged on the display circuit board 30.

The display driver 32 may generate a control signal to be transmitted to the first scan driving circuit SDRV1 and the second scan driving circuit SDRV2. The display driver 32 may generate data signals, and the generated data signals may be transmitted to the first pixel circuits PCm, the second pixel circuits PCa, the third pixel circuits PCt1, and the fourth pixel circuits PCt2 through a fanout line FW and a data line DL connected to the fanout line FW.

The display driver 32 may supply a driving voltage ELVDD to the driving voltage supply line 11 and may supply a common voltage ELVSS to the common voltage supply line 13. The driving voltage ELVDD may be applied to the first pixel circuits PCm, the second pixel circuits PCa, the third pixel circuits PCt1, and the fourth pixel circuits PCt2 through a driving voltage line connected to the driving voltage supply line 11, and the common voltage ELVSS may be applied to counter electrodes of the first display elements DEm, the second display elements DEa, the third display elements DEt1, and the fourth display elements DEt2 through the common voltage supply line 13.

The driving voltage supply line 11 may extend in the x direction under the first display area DA1. The common voltage supply line 13 may have a loop shape of which one side is open, and may surround a portion of the first display area DA1.

Figure 4:
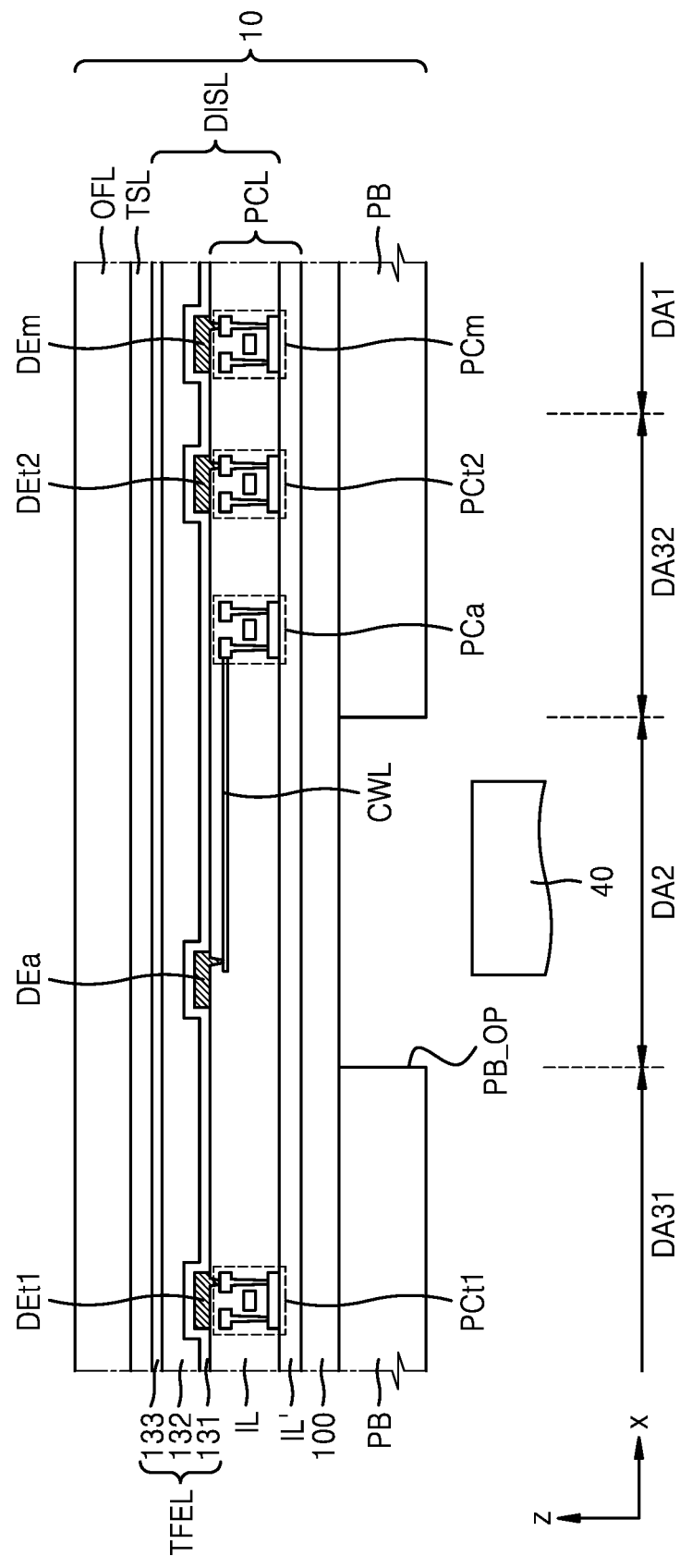
FIG. 4 is a cross-sectional view schematically illustrating a portion of the display panel of FIG. 2.

FIG. 4 is a cross-sectional view schematically illustrating a portion of the display panel 10 of FIG. 2.

Referring to FIG. 4, the display apparatus 1 may include the display panel 10 and a component 40 overlapping the display panel 10. A cover window for protecting the display panel 10 may further be arranged above the display panel 10.

The display panel 10 may include a substrate 100, a display layer DISL arranged on the substrate 100, a touch sensor layer TSL, an optical functional layer OFL, and a panel protection member PB arranged under the substrate 100. The display panel 10 may include the first display area DA1, the second display area DA2, and the third display area DA3. The second display area DA2 may overlap the component 40.

The substrate 100 may include an insulating material, such as glass, quartz, or polymer resin. The substrate 100 may be a rigid substrate or may be a flexible substrate capable of bending, folding, rolling, etc.

The display layer DISL may include a circuit layer PCL, display elements disposed on the circuit layer PCL, and an encapsulation layer, such as a thin-film encapsulation layer TFEL or an encapsulation substrate. Insulating layers IL and IL' may be arranged between the substrate 100 and the display layer DISL and in the display layer DISL.

The first pixel circuit PCm and the first display element DEm connected thereto may be arranged in the first display area DA1 of the display panel 10. The first pixel circuit PCm may include at least one thin-film transistor, and may control emission of the first display element DEm.

The third display area DA3 of the display panel 10 may include the first sub display area DA31 and the second sub display area DA32. The third pixel circuit PCt1 and the third display element DEt1 connected thereto may be arranged in the first sub display area DA31. The third pixel circuit PCt1 may include at least one thin-film transistor, and may control emission of the third display element DEt1. The fourth pixel circuit PCt2 and the fourth display element DEt2 connected thereto may be arranged in the second sub display area DA32. The fourth pixel circuit PCt2 may include at least one thin-film transistor, and may control emission of the fourth display element DEt2.

The second display element DEa may be arranged in the second display area DA2 of the display panel 10.

According to some embodiments, the second pixel circuit PCa for controlling the second display element DEa may be arranged outside the second display area DA2 rather than the second display area DA2. According to some embodiments, the second pixel circuit PCa may be arranged in a second sub display area DA32 of the third display area DA3 arranged between the first display area DA1 and the second display area DA2. The second pixel circuit PCa may include at least one thin-film transistor, and may be electrically connected to the second display element DEa by the connection line CWL. The connection line CWL may include a transparent conducting oxide TCO. For example, the connection line CWL may include a conductive oxide, such as indium tin oxide (ITO), indium zinc oxide (IZO), zinc oxide (ZnO), indium oxide ($In_2O_3$), indium gallium oxide (IGO), and/or aluminum zinc oxide (AZO).

The component 40 is a camera using infrared or visible light, and may include an imaging device. Alternatively, the component 40 may be a solar battery, a flash, an illuminance sensor, a proximity sensor, or an iris sensor. Alternatively, the component 40 may have a function of receiving sound. To keep restrictions on functions of the component 40 to a minimum, the second pixel circuit PCa for driving the second display element DEa arranged in the second display area DA2 may not be arranged in the second display area DA2, but may be arranged in the second sub display area DA32 of the third display area DA3. Thus, the display panel 10 in the second display area DA2 may have a relatively higher transmittance than the display panel 10 in the third display area DA3. In addition, the display panel 10 in the second display area DA2 may have a higher transmittance than the display panel 10 in the first display area DA1. A plurality of components 40 may be arranged in the second display area DA2. The plurality of components 40 may have different functions from one another.

The second display area DA2 may include a transmission area in which light/signals emitted from the component 40 or light/signals incident on the component 40 transmit. The transmission area in the second display area DA2 may be a remaining area in which a pixel electrode (anode) of the second display element DEa is not arranged. The transmission area may be an area excluding the area in which the second display element DEa emits light. The transmission area may include an area between the second display elements DEas. Only some of the insulating layers IL and IL' may be arranged in the transmission area. A counter electrode (cathode) may be arranged in the transmission area. An inorganic encapsulation layer and/or an organic encapsulation layer of the thin film encapsulation layer TFEL may be arranged in the transmission area. A conductive line formed of metal and/or a transparent conductive material may be arranged in the transmission area. The substrate 100, a polarizer and an adhesive, a window, and a panel protection member PB may be arranged in the transmission area.

The encapsulation layer may be arranged on the display elements. The display elements may be covered by the thin film encapsulation layer TFEL or the encapsulation substrate.

According to some embodiments, the thin film encapsulation layer TFEL may include at least one inorganic encapsulation layer and at least one organic encapsulation layer. According to some embodiments, the thin film encapsulation layer TFEL may include a first inorganic encapsulation layer 131, an organic encapsulation layer 132, and a second inorganic encapsulation layer 133, which are sequentially stacked. The first inorganic encapsulation layer 131 and the second inorganic encapsulation layer 133 may include at least one inorganic insulating material, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), or hafnium oxide ($HfO_2$). The organic encapsulation layer 132 may include a polymer-based material. Examples of the polymer-based material may include silicon-based resin, acryl-based resin, epoxy-based resin, polyimide, and polyethylene.

According to some embodiments, the encapsulation substrate may be arranged to face the substrate 100 with the display elements therebetween. The substrate 100 may be coupled to the encapsulation substrate with a sealing member, thereby sealing an inner space between the substrate 100 and the encapsulation substrate. The encapsulation substrate may include glass. The sealing member may be a sealant, and according to some embodiments, the sealing member may include a material hardened by laser. For example, the sealing member may be frit.

The touch sensor layer TSL may obtain coordinate information according to an external input, for example, a touch event. The touch sensor layer TSL may include a touch electrode and detection lines connected to the touch electrode. The touch sensor layer TSL may sense an external input in a self-capacitance manner or a mutual capacitance manner. The touch sensor layer TSL may be formed on the thin film encapsulation layer TFEL. Alternatively, the touch sensor layer TSL may be separately formed on a touch substrate and then be coupled to the thin film encapsulation layer TFEL through an adhesive layer, such as an optical clear adhesive OCA. According to some embodiments, the touch sensor layer TSL may be directly formed on the thin film encapsulation layer TFEL, and in this case, no adhesive layer may be arranged between the touch sensor layer TSL and the thin film encapsulation layer TFEL.

The optical functional layer OFL may include an anti-reflection layer. The anti-reflection layer may reduce a reflectance of light (external light) incident from the outside on the display apparatus 1. In some embodiments, the optical functional layer OFL may include a polarization film. In some embodiments, the optical functional layer OFL may include a filter plate including a black matrix and color filters.

The panel protection member PB may be attached under the substrate 100 to support and protect the substrate 100. The panel protection member PB may include an opening PB_OP corresponding to the second display area DA2. Because the panel protection member PB includes the opening PB_OP, the light transmittance of the second display area DA2 may be improved. The panel protection member PB may include polyethylene terephthalate (PET) or polyimide (PI). The area of the second display area DA2 may be greater than the area in which the component 40 is arranged. Accordingly, the area of the opening PB_OP in the panel protection member PB may not match the area of the second display area DA2. However, embodiments according to the present disclosure are not limited thereto. For example, the panel protection member PB may be arranged continuously and correspondingly to the second display area DA2 without having an opening PB_OP.

Figure 5:
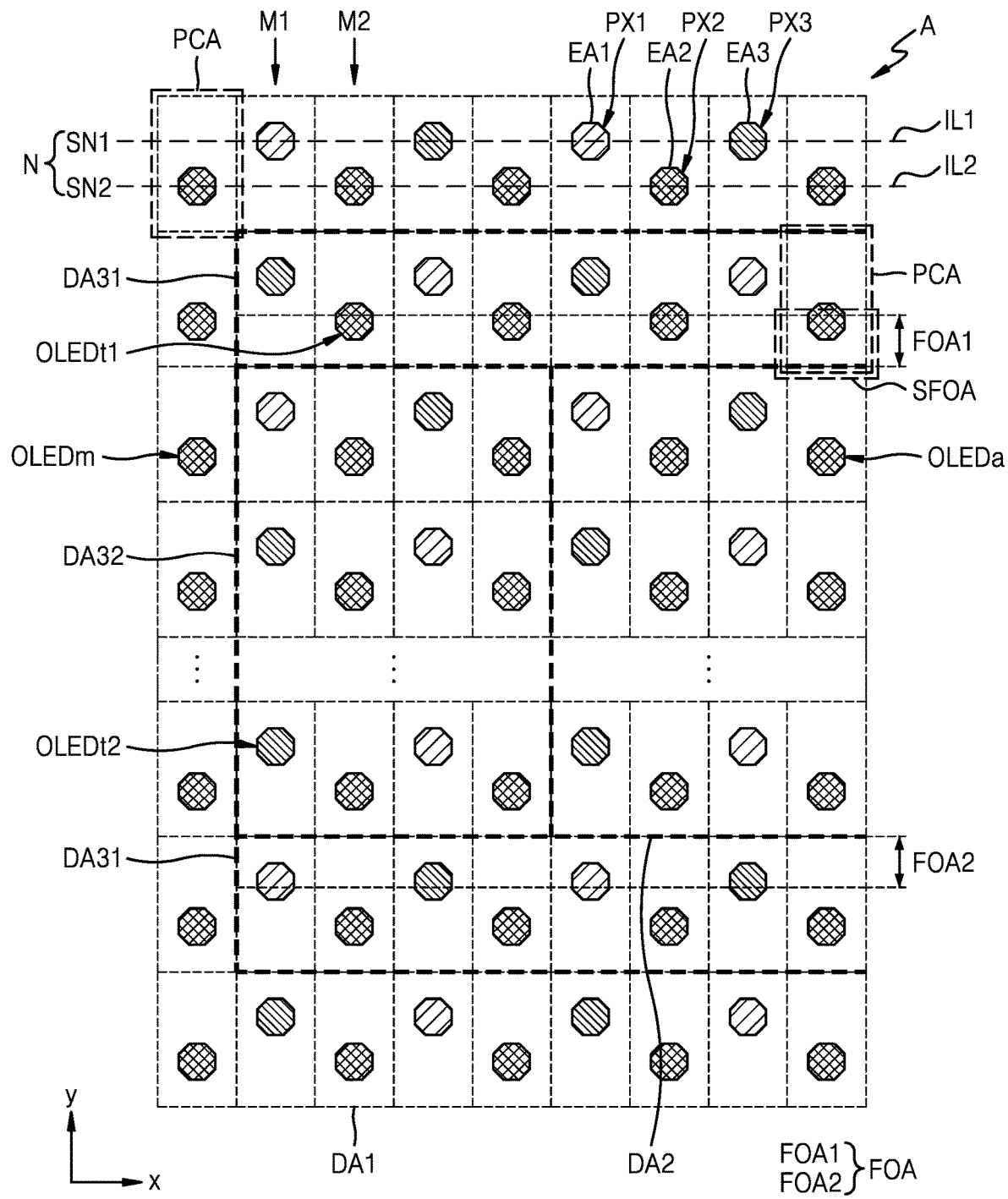
FIGS. 5 and 6 are enlarged views of region A of the display panel of FIG. 2, according to some embodiments.
Figure 6:
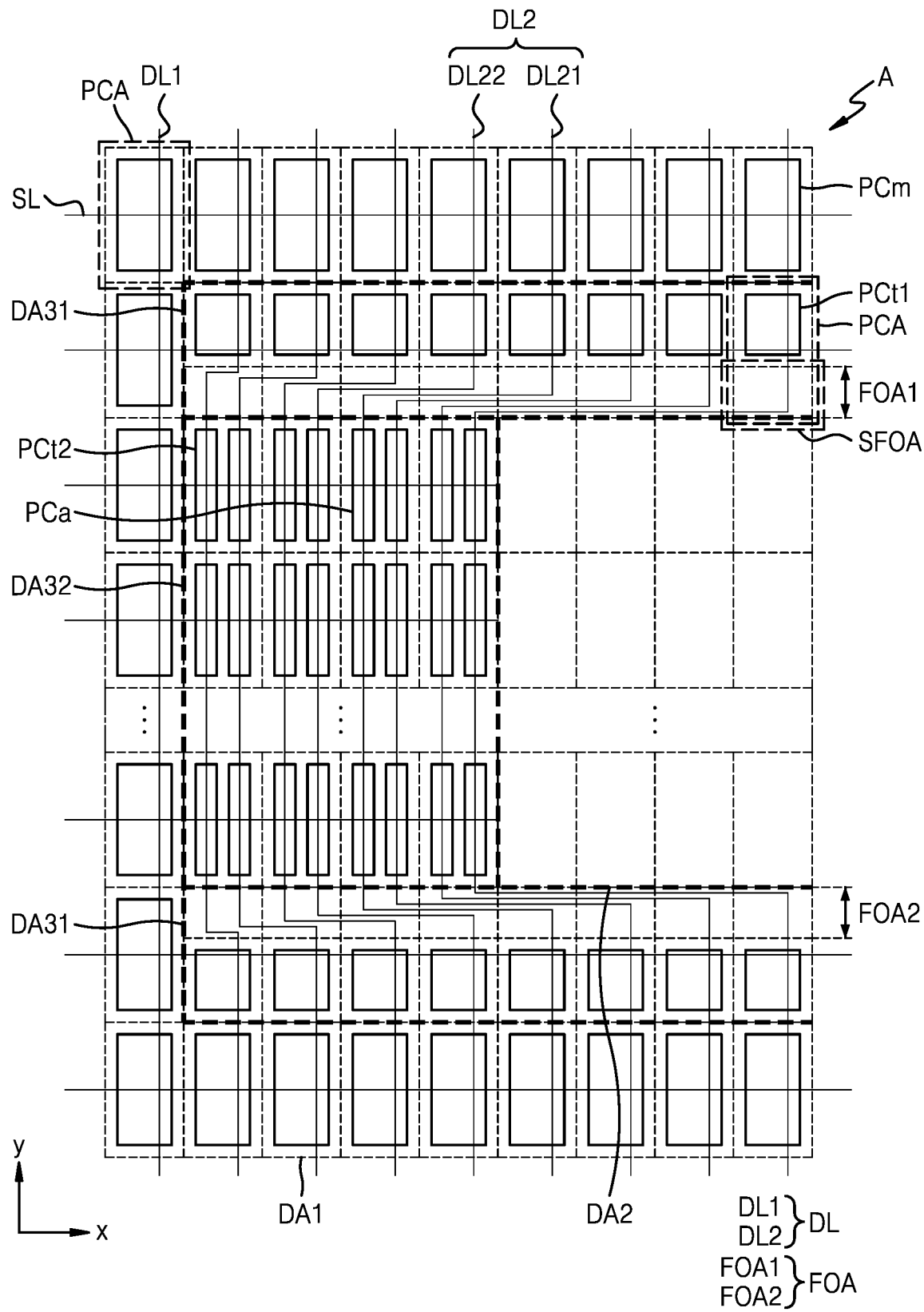
Figure 7:
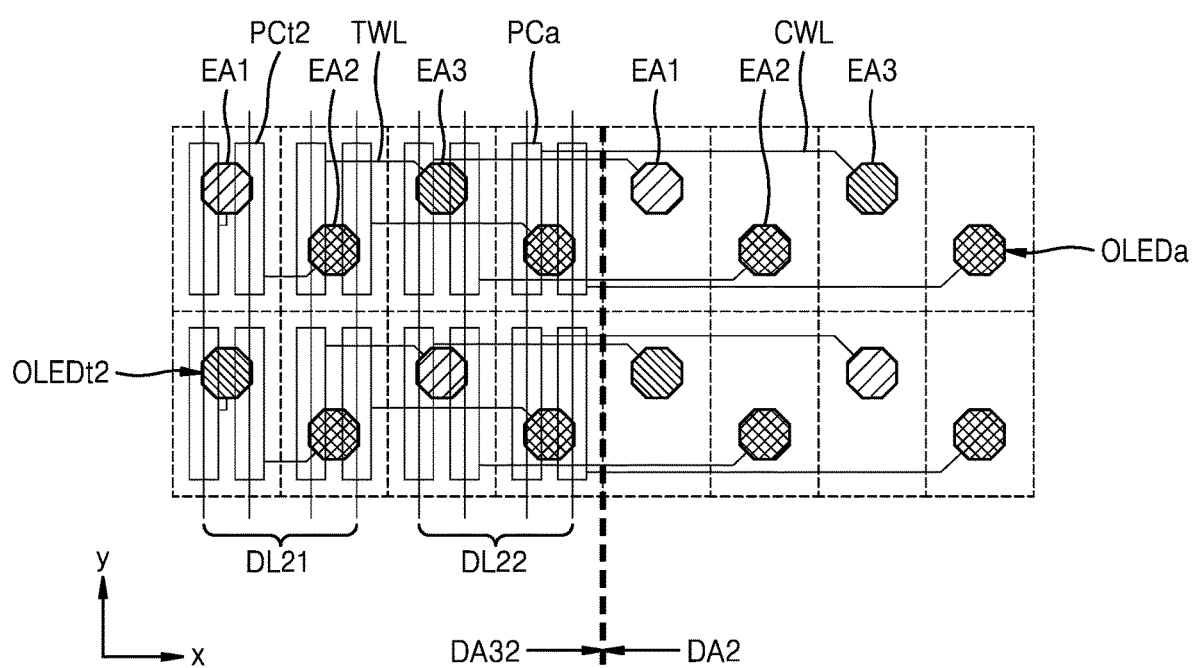
FIG. 7 is a diagram showing a connection between a pixel circuit and a display element in a second display area and a third display area according to some embodiments.

FIGS. 5 and 6 are enlarged views of region A of the display panel 10 of FIG. 2, according to some embodiments. FIG. 7 is a diagram showing a connection between the pixel circuit and the display element in the second display area and the third display area according to some embodiments. FIG. 5 is a diagram showing a schematic arrangement of an emission area of the A region of the display panel 10. FIG. 6 is a diagram showing a schematic arrangement of the pixel circuit of the A region of the display panel 10.

Referring to FIG. 5, the plurality of pixels arranged in the display area DA may include a first subpixel PX1 emitting light of a first color, a second subpixel PX2 emitting light of a second color, and a third subpixel PX3 emitting light of a third color. The first subpixel PX1, the second subpixel PX2, and the third subpixel PX3 may be repeatedly arranged in the x direction and the y direction according to a preset pattern. The first subpixel PX1, the second subpixel PX2, and the third subpixel PX3 may each include a pixel circuit and a display element electrically connected to the pixel circuit. According to some embodiments, the display element may be an OLED.

The emission area of each of the first subpixel PX1, the second subpixel PX2, and the third subpixel PX3 is an area where the emission layer of the OLED is arranged. The emission area may be defined by an opening of a pixel defining layer. This will be described later.

In a first column M1, a first emission area EA1 of the first subpixel PX1 and a third emission area EA3 of the third subpixel PX3 may be arranged alternately in the y direction. In a second column M2, a second emission area EA2 of the second subpixel PX2 may be repeatedly arranged in the y direction. The first column M1 and the second column M2 may be alternately arranged in the x direction, and the arrangement of the first emission area EA1 of the first subpixel PX1 and the third emission area EA3 of the third subpixel PX3 of adjacent first columns M1 may be opposite to each other.

In a first sub row SN1 of each row N, the first emission area EA1 of the first subpixel PX1 and the third emission area EA3 of the third subpixel PX3 may be alternately arranged along a first virtual line IL1 in the x direction, and in a second sub row SN2 of each row N, the second emission area EA2 of the second subpixel PX2 may be repeatedly arranged along a second virtual line IL2 in the x direction. That is, in each row N, the first emission area EA1 of the first subpixel PX1, the second emission area EA2 of the second subpixel PX2, the third emission area EA3 of the third subpixel PX3, and the second emission area EA2 of the second pixel PX2 may be repeatedly arranged in a zigzag.

In FIG. 5, although the first emission area EA1, the second emission area EA2, and the third emission area EA3 are shown to have the same area, this is merely an example. The first emission area EA1 of the first subpixel PX1, the second emission area EA2 of the second subpixel PX2, and the third emission area EA3 of the third subpixel PX3 may have different areas from each other. According to some embodiments, the third emission area EA3 of the third subpixel PX3 may have a larger area than the first emission area EA1 of the first subpixel PX1. In addition, the third emission area EA3 of the third subpixel PX3 may have a larger area than the second emission area EA2 of the second subpixel PX2. The first emission area EA1 of the first subpixel PX1 may have a larger area than the second emission area EA2 of the second subpixel PX2. According to some embodiments, the third emission area EA3 of the third subpixel PX3 may have the same area as the first emission area EA1 of the first subpixel PX1. However, embodiments according to the present disclosure are not limited thereto. Various embodiments are possible including, for example, the first emission area EA1 of the first subpixel PX1 being greater than the second emission area EA2 of the second subpixel PX2 and the third emission area EA3 of the third subpixel PX3.

The first to third emission areas EA1, EA2, and EA3 may have a polygonal shape, such as a rectangle, octagon, etc., a circular shape, or an oval shape, and polygons with round corners (vertices) may also be included. According to some embodiments, the first subpixel PX1 may include a red pixel that emits red light, the second subpixel PX2 may include a green pixel that emits green light, and the third subpixel PX3 may include a blue pixel that emits blue light.

As shown in FIG. 5, the first display area DA1, the second display area DA2, and the third display area DA3 may have the same resolution according to some embodiments. That is, the number per unit area of display elements arranged in each of the first display area DA1, the second display area DA2, and the third display area DA3 may be identical to each other. According to some embodiments, the resolution of the first display area DA1 may be higher than those of the second display area DA2 and the third display area DA3.

As shown in FIG. 5, the first to third emission areas EA1, EA2, and EA3 may have the same size in each of the first display area DA1, the second display area DA2, and the third display area DA3. According to some embodiments, the first emission area EA1 of the first display area DA1 may be smaller than the first emission area EA1 of each of the second display area DA2 and the third display area DA3. In this case, the number per unit area of display elements in the first display area DA1 may be greater than that of the second display area DA2 and the third display area DA3.

Referring to FIGS. 5 and 6, the display area DA may include a plurality of pixel areas PCA. The plurality of pixel areas PCA may be repeatedly arranged in the x and y directions. The pixel area PCA may be an area in which the pixel circuit of one pixel is arranged. As a display element of each pixel, the OLED may be disposed on an upper layer of the pixel circuit. The OLED may be arranged directly over the pixel circuit connected thereto to overlap the pixel circuit or may be arranged to overlap a portion of a pixel circuit of another pixel arranged in an adjacent row and/or column by being offset from the pixel circuit. FIG. 5 is an example in which the OLED of each pixel is arranged to overlap the pixel circuit connected to the OLED in each pixel area PCA.

The first pixel circuit PCm and a first light-emitting diode OLEDm of the first pixel Pm may be arranged in the pixel area PCA of the first display area DA1. According to some embodiments, the first light-emitting diode OLEDm may overlap the first pixel circuit PCm in the pixel area PCA of the first display area DA1. A second organic light-emitting diode OLEDa of the second pixel Pa may be arranged in the pixel area PCA of the second display area DA2. Because the second pixel circuit PCa of the second pixel Pa is arranged in the second sub display area DA32, the second organic light-emitting diode OLEDa may not overlap the second pixel circuit PCa in the pixel area PCA of the second display area DA2.

Each of the first sub display areas DA31 of the third display area DA3 may be an area extending in the x direction by including the pixel areas PCA in a same row adjacent to the pixel areas PCA of the first display area DA1. The third pixel circuit PCt1 and a third organic light-emitting diode OLEDt1 of the third pixel Pt1 may be arranged in the pixel area PCA of the first sub display area DA31 of the third display area DA3. The y direction line width of some devices constituting the third pixel circuit PCt1 may be less than the y direction line width of the devices constituting the first pixel circuit PCm. The arrangement of some devices constituting the third pixel circuit PCt1 in the x direction and/or the y direction may be different from the arrangement of the devices constituting the first pixel circuit PCm in the x direction and/or the y direction. Accordingly, the y-direction size of the third pixel circuit PCt1 arranged in the pixel area PCA of the first sub display area DA31 may be reduced compared to the y-direction size of the first pixel circuit PCm arranged in the pixel area PCA of the first display area DA1, and the pixel area PCA of the first sub display area DA31 may include a sub bypass area SFOA. The sub bypass area SFOA may be an area of the pixel area PCA of the first display area DA1 or the first sub display area DA31 excluding an area of the pixel area PCA by as much as the y-direction size of the third pixel circuit PCt1. The sub bypass areas SFOA of the pixel areas PCA may be located continuously in the x direction in the first sub display area DA31, thereby allowing the first bypass area FOA1 or the second bypass area FOA2 to extend in the x direction to be located in the first sub display area DA31. Each of the first bypass area FOA1 and the second bypass area FOA2 may be an area including the sub bypass areas SFOA arranged in the x direction in a same row and extending in the x direction. The bypass area FOA may be an area in which the pixel circuit is not arranged and the extension direction of the data line DL changes. A portion of the data line DL extending in the x direction may be arranged in the bypass area FOA.

According to some embodiments, some of the third organic light-emitting diodes OLEDt1 may be arranged to overlap the third pixel circuit PCt1 and not overlap the sub bypass area SFOA or the bypass area FOA in the pixel area PCA of the first sub display area DA31. Furthermore, some other third organic light-emitting diodes OLEDt1 may be arranged to partially overlap the third pixel circuit PCt1 and the sub bypass area SFOA or the bypass area FOA.

In FIGS. 5 and 6, although the sub bypass area SFOA has been described as being included in the pixel area PCA of the first sub display area DA31, each pixel area PCA of the first sub display area DA31 may be understood as a reduced pixel area, and the sub bypass area SFOA may be understood as a border area between the first sub display area DA31 and the second sub display area DA32 and between the first sub display area DA31 and the second display area DA2. In this case, the pixel area PCA of the first sub display area DA31 may be an area in which the pixel area PCA of the first sub display area DA31 and the sub bypass area SFOA are combined. The bypass area FOA may include the sub bypass areas SFOA arranged in the x direction, and may be a continuous border area between the first sub display area DA31 and the second sub display area DA32 and between the first sub display area DA31 and the second display area DA2.

The fourth pixel circuit PCt2 and a fourth organic light-emitting diode OLEDt2 of the fourth pixel Pt2 may be arranged in the pixel area PCA of the second sub display area DA32 of the third display area DA3. The second pixel circuit PCa of the second pixel Pa may further be arranged in the pixel area PCA of the second sub display area DA32. According to some embodiments, a pair of fourth pixel circuits PCt2 of the fourth pixel Pt2 may be arranged adjacently in the x direction in some pixel areas PCA of the second sub display area DA32. A pair of second pixel circuits PCa of the second pixels Pt2 may be arranged adjacent to each other in the x direction in some pixel areas PCA of the second sub display area DA32. According to some embodiments, a pair of fourth pixel circuits PCt2 may be arranged adjacent to each other in the y direction or a pair of second pixel circuits PCa may be arranged adjacent to each other in the y direction in the pixel area PCA of the second sub display area DA32. According to some embodiments, some fourth organic light-emitting diodes OLEDt2 may be arranged to overlap a portion of the fourth pixel circuit PCt1 and/or the second pixel circuit PCa in the pixel area PCA of the second sub display area DA32.

As shown in FIG. 7, the fourth pixel circuit PCt2 of the fourth pixel Pt2 in the second sub display area DA32 may be electrically connected to the fourth organic light-emitting diode OLEDt2 in the second sub display area DA32 through a first connection line TWL. Alternatively, the fourth pixel circuit PCt2 of the fourth pixel Pt2 in the second sub display area DA32 may be electrically connected to the fourth organic light-emitting diode OLEDt2 in the second sub display area DA32 without using the first connection line TWL. In addition, the second pixel circuit PCa of the second pixel Pa in the second sub display area DA32 may be electrically connected to the second organic light-emitting diode OLEDa of the second pixel Pa in the second display area DA2 through a second connection line CWL.

A plurality of data lines DL and a plurality of scan lines SL may be arranged in the display area DA. The plurality of scan lines SL may extend in the x direction, and some scan lines SL may be disconnected with the second display area DA2 therebetween.

The plurality of data lines DL may include first data lines DL1 extending in the y direction in the first display area DA1 and second data lines DL2 passing across the third display area DA3 and extending in the y direction in the first display area DA1.

Each first data line DL1 may be connected to the first pixel circuits PCm arranged in the same column as that of the first data line DL1 in the first display area DA1. The second data lines DL2 may be connected to the first pixel circuits PCm in the first display region DA1 and the third pixel circuits PCt1 in the first sub display area DA31, which are both arranged in the same column as that of the second data line DL2. The second data lines DL2 may include third data lines DL21 and the fourth data lines DL22. The third data line DL21 may be connected to the fourth pixel circuits PCt2 arranged in the second sub display area DA32. The fourth data line DL22 may be connected to the second pixel circuits PCa arranged in the second sub display area DA32. According to some embodiments, groups of the third data lines DL21 and groups of the fourth data lines DL22 may be arranged alternately in the x direction in the second sub display area DA32.

Some of the third data lines DL21 and the fourth data lines DL22 may pass across the upper and lower first sub display areas DA31 and left second sub display area DA32, and may change their extension directions in the first bypass area FOA1 and the second bypass area FOA2. Some of the third data lines DL21 and the fourth data lines DL22 may pass across the upper and lower first sub display areas DA31 and the right second sub display area DA32, and may change their extension directions in the first bypass area FOA1 and the second bypass area FOA2.

Figure 8:
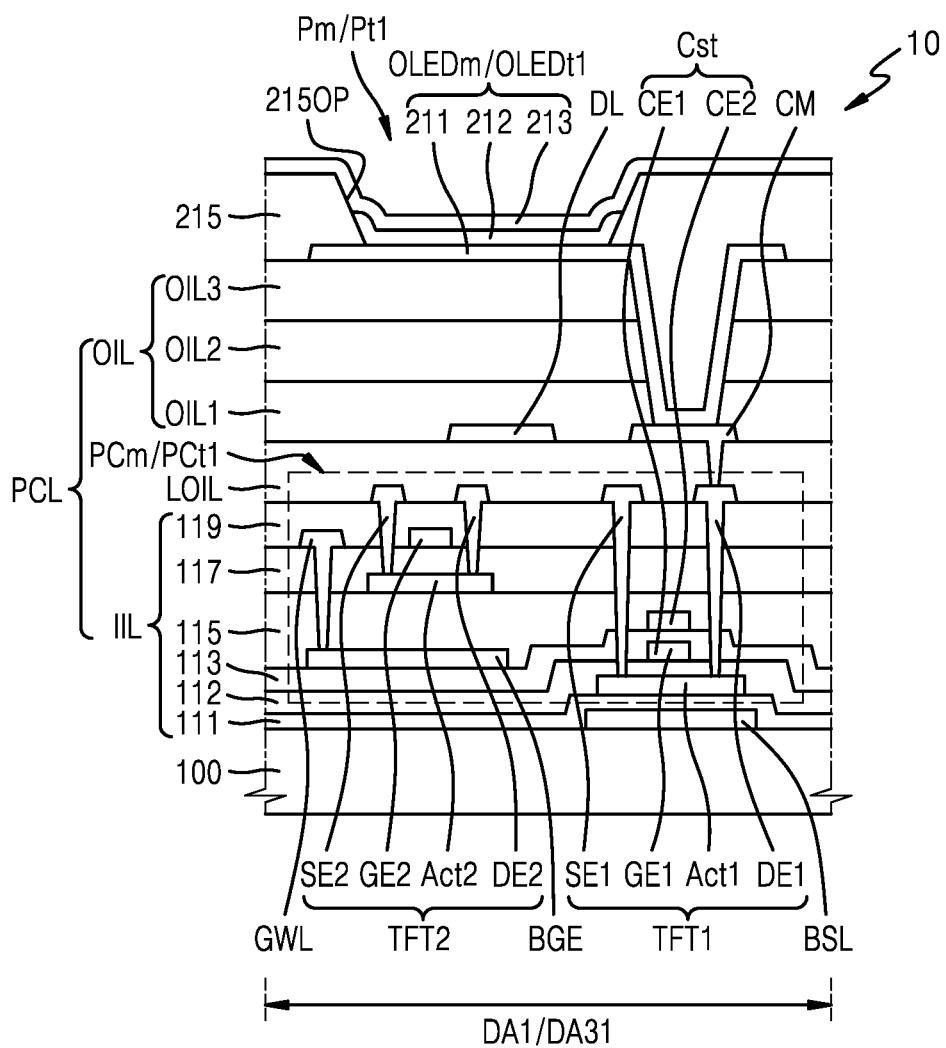
FIGS. 8 to 12 are cross-sectional views schematically illustrating a portion of the display panel according to some embodiments.
Figure 9:
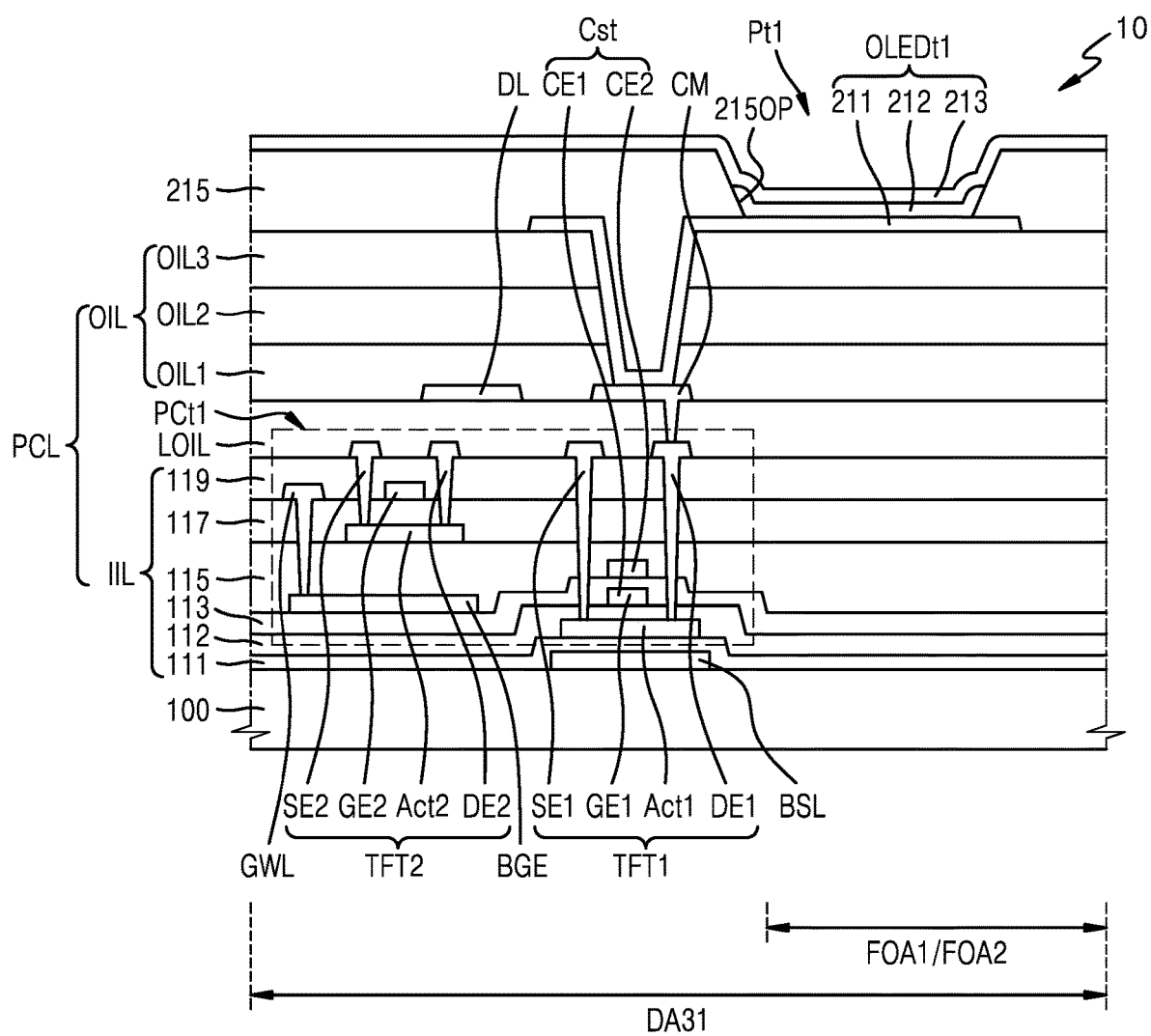
Figure 10:
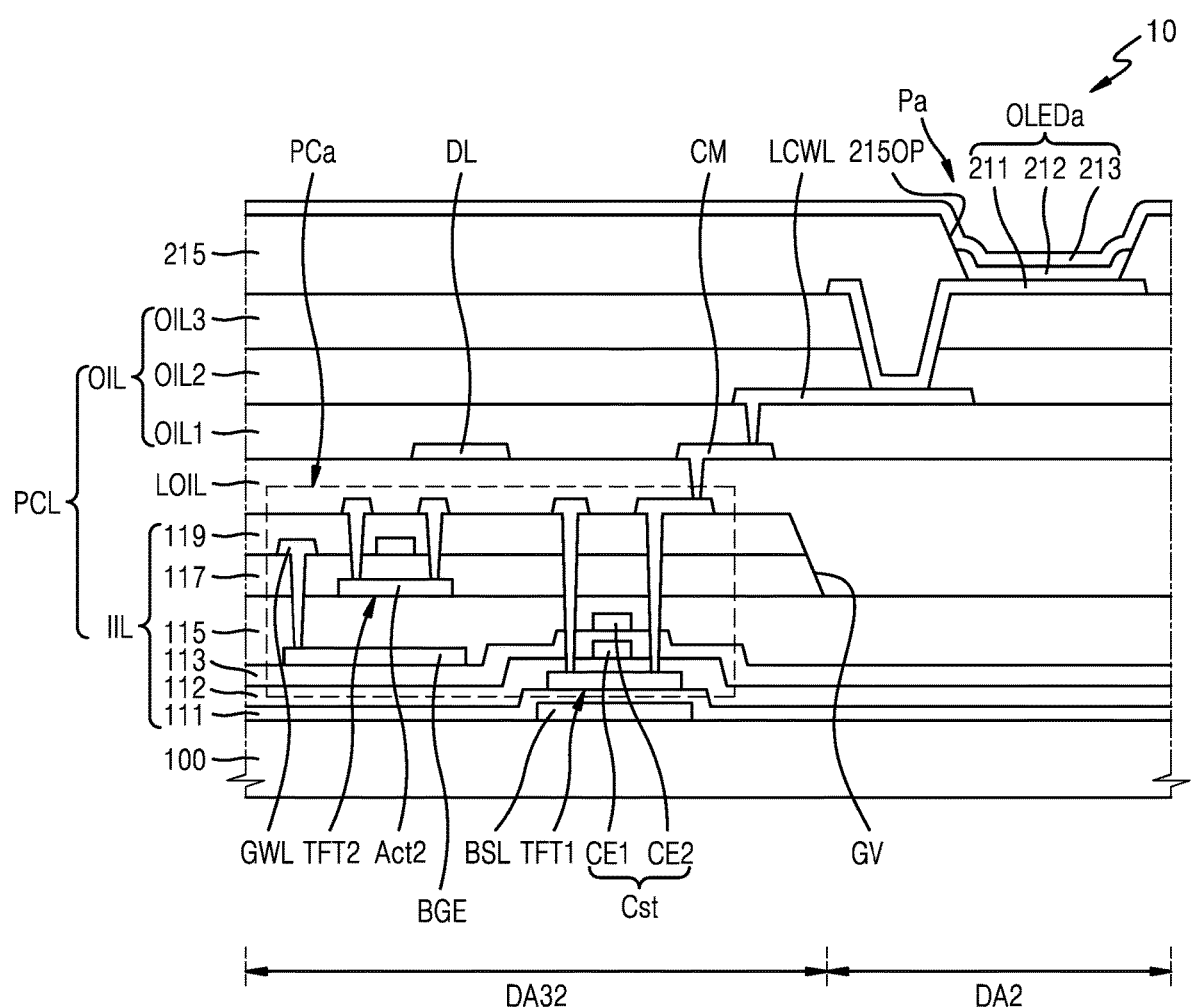
Figure 11:
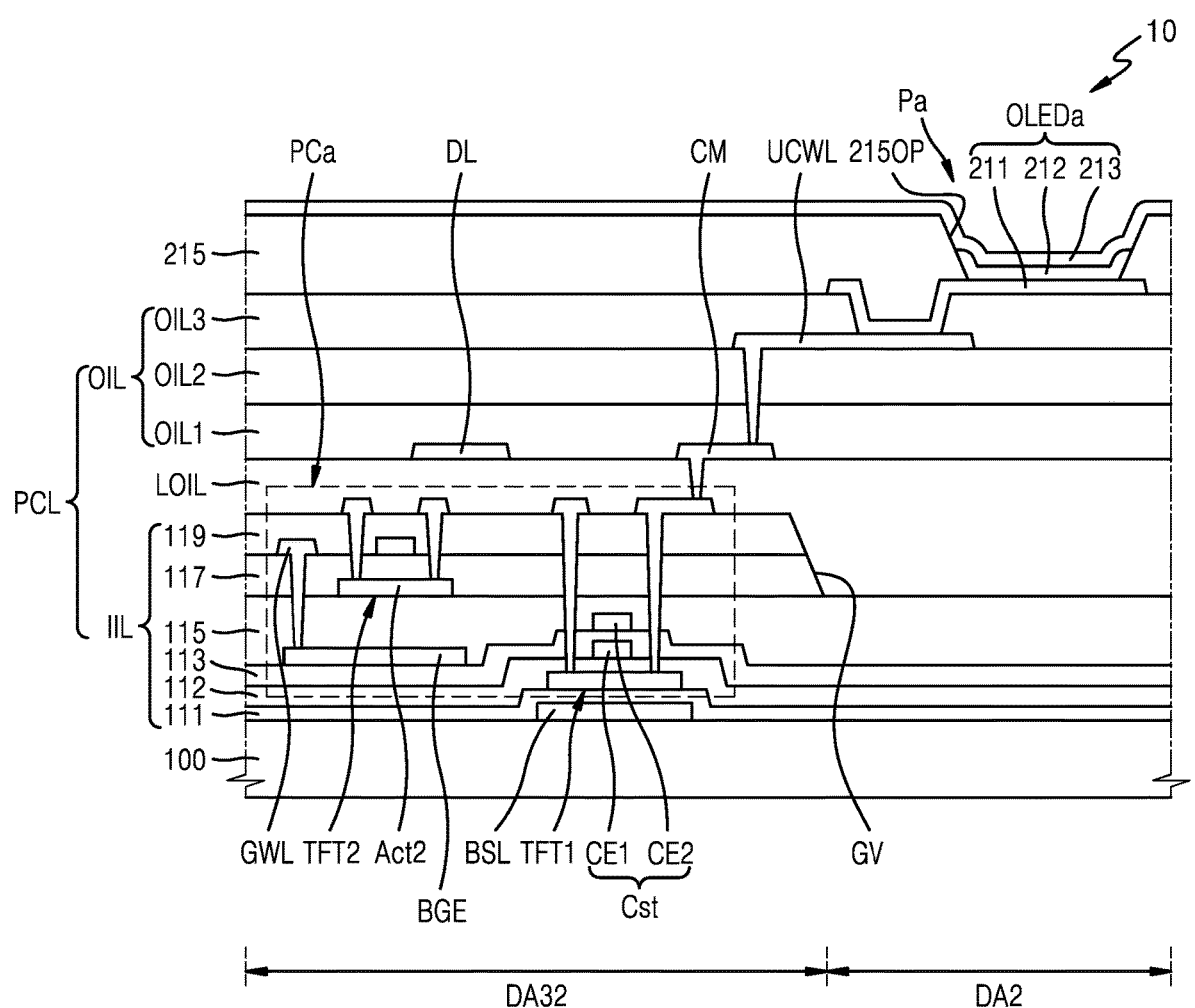
Figure 12:
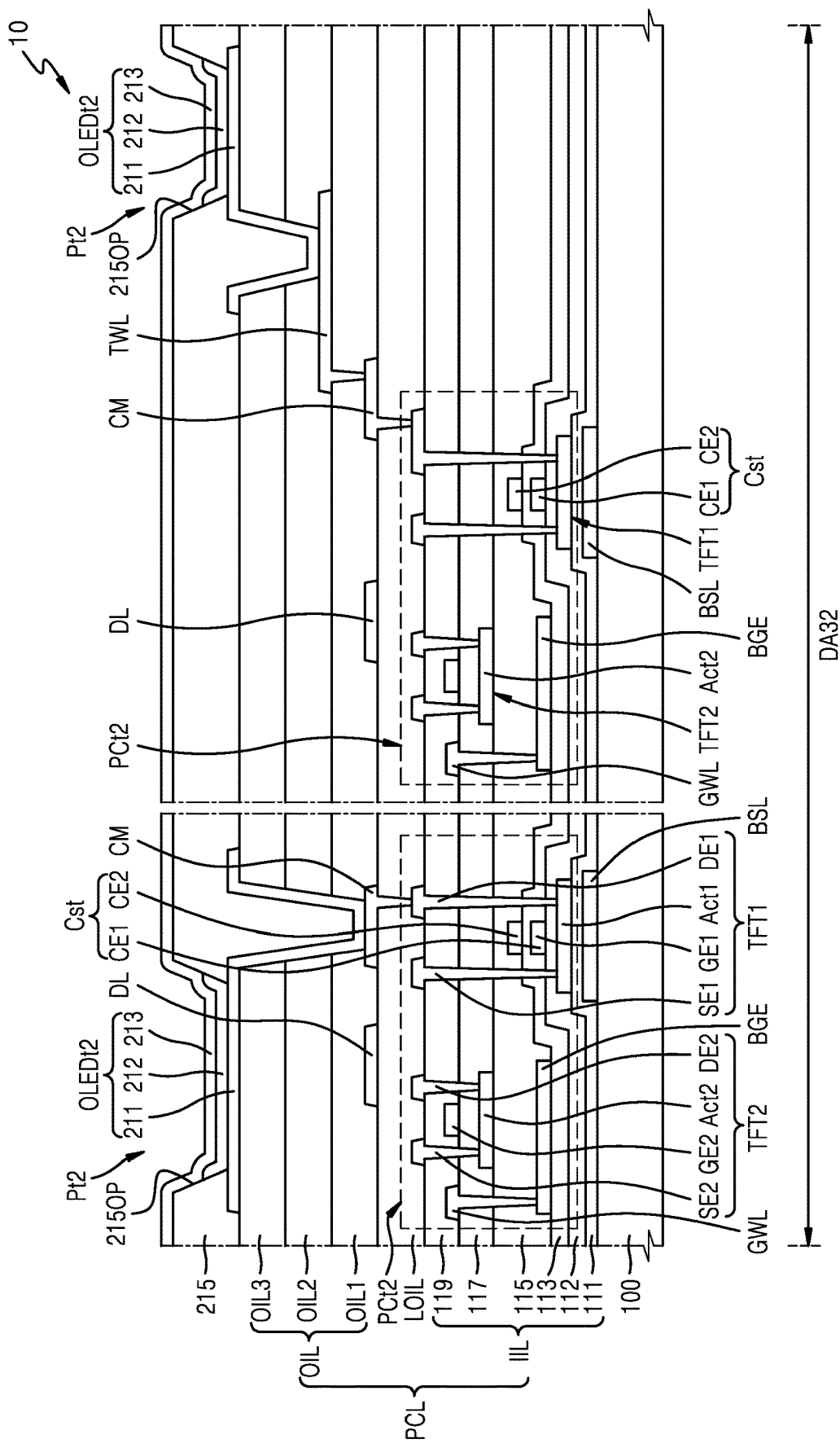

FIGS. 8 to 12 are cross-sectional views schematically illustrating of a portion of the display panel according to some embodiments. FIG. 8 is a cross-sectional view schematically illustrating a portion of the first pixel Pm or the third pixel Pt1. FIG. 9 is a cross-sectional view schematically illustrating a portion of the third pixel Pt1. FIGS. 10 and 11 are cross-sectional views schematically illustrating a portion of the second pixel Pa. FIG. 12 is a cross-sectional view schematically illustrating a portion of the fourth pixel Pt2.

The first pixel circuit PCm and the first organic light-emitting diode OLEDm that is connected to the first pixel circuit PCm may be arranged in the first display area DA1. The third pixel circuit PCt1 and the third organic light-emitting diode OLEDt1 that is connected to the third pixel circuit PCt1 may be arranged in the first sub display area DA31. The second organic light-emitting diode OLEDa may be arranged in the second display area DA2, and the second organic light-emitting diode OLEDa may be connected to the second pixel circuit PCa arranged in the second sub display area DA32. The fourth pixel circuit PCt2 and the fourth organic light-emitting diode OLEDt2 that is connected to the fourth pixel circuit PCt2 may be arranged in the second sub display area DA32.

According to some embodiments, the first pixel circuit PCm, the second pixel circuit PCa, the third pixel circuit PCt1, and the fourth pixel circuit PCt2 may each include a first thin film transistor TFT1 including a silicon semiconductor and a second thin film transistor TFT2 including an oxide semiconductor. The first pixel circuit PCm, the second pixel circuit PCa, the third pixel circuit PCt1, and the fourth pixel circuit PCt2 may each further include a capacitor Cst.

The first thin film transistor TFT1 may include a first semiconductor layer Act1 including a silicon semiconductor and a first gate electrode GE1 insulated from the first semiconductor layer Act1. The first thin film transistor TFT1 may include a first source electrode SE1 and/or a first drain electrode DE1 that are connected to the first semiconductor layer Act1. The first thin film transistor TFT1 may act as a driving thin film transistor.

The second thin film transistor TFT2 may include a second semiconductor layer Act2 including an oxide semiconductor and a second gate electrode GE2 insulated from the second semiconductor layer Act2. The second thin film transistor TFT2 may include a second source electrode SE2 and/or a second drain electrode DE2 that are connected to the second semiconductor layer Act2. The second thin film transistor TFT2 may act as a switching thin film transistor. Alternatively, the second thin film transistor TFT2 may be a different thin film transistor than the driving thin film transistor.

In the present embodiments, the power consumption of the display apparatus may be reduced by including an active layer consisting of an oxide semiconductor in at least one of the thin film transistors excluding the driving thin film transistor.

In addition, a lower blocking layer BSL that overlaps the first thin film transistor TFT1 may be arranged in the lower portion of the first thin film transistor TFT1 according to some embodiments. A constant voltage may be applied to the lower blocking layer BSL. Because the lower blocking layer BSL is arranged under the first thin film transistor TFT1, the first thin film transistor TFT1 may be less affected by surrounding interfering signals and thus have further improved reliability.

In the present disclosure, it is described as an example that an OLED is used as a display element, but according to some embodiments, an inorganic light-emitting device or a quantum dot light-emitting device may be used as a display element.

Hereinafter, referring to FIGS. 8 to 11, components included in the display panel 10 are described.

The substrate 100 may include an insulating material, such as glass, quartz, or polymer resin. The substrate 100 may include a rigid substrate or a flexible substrate capable of bending, folding, rolling, or the like. The substrate 100 may have a single-layer or multi-layer structure of the above material, and in the case of the multi-layer structure, it may further include an inorganic layer. In some embodiments, the substrate 100 may have an organic/inorganic/organic material structure.

A buffer layer 111 may be located over the substrate 100 to reduce or block the penetration of foreign materials, moisture, or external air from under the substrate 100 and may provide a flat surface over the substrate 100. The buffer layer 111 may include an inorganic material, such as oxide or nitride, an organic material, or an organic/inorganic composite, and may include a single-layer or multi-layer structure of an inorganic material and an organic material. In some embodiments, the buffer layer 111 may include silicon oxide ($SiO_2$) or silicon nitride ($SiN_x$).

The lower blocking layer BSL may be arranged between the substrate 100 and the buffer layer 111. The lower blocking layer BSL may be provided with a conductive material. In some embodiments, the lower blocking layer BSL may include a transparent conductive material. For example, the lower blocking layer BSL may include a conductive oxide, such as an indium tin oxide (ITO), an indium zinc oxide (IZO), a zinc oxide (ZnO), an indium oxide ($In_2O_3$), an indium gallium oxide (IGO), or an aluminum zinc oxide (AZO). A barrier layer for blocking the penetration of external air may be further included between the substrate 100 and the lower blocking layer BSL. The barrier layer may include an inorganic material, such as oxide or nitride, or an organic material, or an organic/inorganic complex, and have a single layer or multi-layer structure of an inorganic material and an organic material.

The first semiconductor layer Act1 including a silicon semiconductor may be disposed on the buffer layer 111, and the first semiconductor layer Act1 may include a polysilicon or an amorphous silicon. The first semiconductor layer Act1 may include a channel area, a source area, and a drain area.

A first gate insulating layer 112 may be provided to cover the first semiconductor layer Act1. The first gate insulating layer 112 may include inorganic insulating materials, such as $SiO_2$, $SiN_x$, $SiO_xN_y$, $Al_2O_3$, $TiO_2$, etc. The first gate insulating layer 112 may have a single-layer or multi-layer structure including the inorganic insulating material described above.

The first gate electrode GE1 may be arranged on the first gate insulating layer 112 to overlap the first semiconductor layer Act1. The first gate electrode GE1 may include molybdenum (Mo), aluminum (Al), copper (Cu), titanium (Ti), etc. and may have a single-layer or multi-layer structure. For example, the first gate electrode GE1 may be a single Mo layer.

A second gate insulating layer 113 may cover the first gate electrode GE1. The second gate insulating layer 113 may include inorganic insulating materials, such as $SiO_2$, $SiN_x$, $SiO_xN_y$, $Al_2O_3$, $TiO_2$, etc. The second gate insulating layer 113 may include a single layer or layers including the above inorganic insulating material.

The capacitor Cst may be disposed over the first gate electrode GE1 to overlap the first gate electrode GE1. The capacitor Cst may include a lower electrode CE1 and an upper electrode CE2. The second gate insulating layer 113 may be arranged between the lower electrode CE1 and the upper electrode CE2. The first gate electrode GE1 may function as the gate electrode of the first thin film transistor TFT1, as well as the lower electrode CE1 of the capacitor Cst. That is, the first gate electrode GE1 and the lower electrode CE1 may be an integrated body. The upper electrode CE2 may be disposed over the second gate insulating layer 113 to overlap at least a portion of the lower electrode CE1.

A lower gate electrode BGE may be disposed on the second gate insulating layer 113. The lower gate electrode BGE may overlap the second semiconductor layer Act2 of the second thin film transistor TFT2 and may apply scan signals to the second thin film transistor TFT2. In this case, the second thin film transistor TFT2 may have a double gate electrode structure in which a gate electrode is arranged over and under the second semiconductor layer Act2.

A first interlayer insulating layer 115 may cover an upper electrode CE2 and a lower gate electrode BGE. The first interlayer insulating layer 115 may include $SiO_2$, $SiN_x$, $SiO_xN_y$, $Al_2O_3$, $TiO_2$, etc. The first interlayer insulating layer 115 may have a single-layer or multi-layer structure including the inorganic insulating material described above.

The second semiconductor layer Act2 including an oxide semiconductor may be disposed on the first interlayer insulating layer 115. The second semiconductor layer Act2 may include a channel area, a source area, and a drain area. The second semiconductor layer Act2 may include an oxide of at least one material selected from a group including indium (In), gallium (Ga), tin (Sn), zirconium (Zr), hafnium (Hf), titanium (Ti), and zinc (Zn). According to some embodiments, the second semiconductor layer Act2 may be an In—Ga—Zn—O (IGZO) semiconductor in which a metal, such as In and Ga, is included in ZnO.

The second gate electrode GE2 may be arranged over the second semiconductor layer Act2, and a second interlayer insulating layer 117 may be arranged between the second semiconductor layer Act2 and the second gate electrode GE2. The second gate electrode GE2 may be arranged to overlap the second semiconductor layer Act2, and may be insulated from the second semiconductor layer Act2 by the second interlayer insulating layer 117.

The second interlayer insulating layer 117 may include $SiO_2$, $SiN_x$, $SiO_xN_y$, $Al_2O_3$, $TiO_2$, $Ta_2O_5$, $HfO_2$, or the like. The second interlayer insulating layer 117 may have a single-layer or multi-layer structure including the inorganic insulating material described above.

A signal line GWL may be disposed over the second interlayer insulating layer 117. The signal line GWL may be electrically connected to the lower gate electrode BGE through a contact hole provided in the first interlayer insulating layer 115 and the second interlayer insulating layer 117. The signal line GWL may be a scan line that transmits a scan signal to the lower gate electrode BGE.

A third interlayer insulating layer 119 may be disposed over the second gate electrode GE2. The first source electrode SE1 and/or first drain electrode DE1 connected to the first semiconductor layer Act1 and the second source electrode SE2 and/or the second drain electrode DE2 connected to the second semiconductor layer Act2 may be disposed over the third interlayer insulating layer 119.

The third interlayer insulating layer 119 may include $SiO_2$, $SiN_x$, $SiO_xN_y$, $Al_2O_3$, $TiO_2$, $Ta_2O_5$, $HfO_2$, or the like. The third interlayer insulating layer 119 may have a single-layer or multi-layer structure including the inorganic insulating material described above.

The first source electrode SE1 and/or the first drain electrode DE1, and the second source electrode SE2 and/or the second drain electrode DE2 may be provided with materials having high conductivity, such as metal, conductive oxides, or the like. For example, the first source electrode SE1 and/or the first drain electrode DE1, and the second source electrode SE2 and/or the second drain electrode DE2 may have a single-layer or multi-layer structure including aluminum (Al), copper (Cu), titanium (Ti), or the like. In some embodiments, the first source electrode SE1 and/or the first drain electrode DE1, and the second source electrode SE2 and/or the second drain electrode DE2 may have be provided as a triple layer of Ti, Al, and Ti (Ti/Al/Ti) that are sequentially arranged.

The lower organic insulating layer LOIL may be arranged on the first source electrode SE1 and/or the first drain electrode DE1, and the second source electrode SE2 and/or the second drain electrode DE2. The lower organic insulating layer LOIL may include organic materials.

The connection electrode CM may be disposed over the lower organic insulating layer LOIL. The connection electrode CM may be electrically connected to the first drain electrode DE1 or the first source electrode SE1 through a contact hole of the lower organic insulating layer LOIL. The connection electrode CM may include a conductive material including Mo, Al, Cu, Ti, etc. and may have a single or multi-layer structure including the conductive material. For example, the connection electrode CM may have a multi-layer structure including Ti/Al/Ti.

The data line DL may be arranged on the lower organic insulating layer LOIL. In addition, a driving voltage line for transmitting the driving voltage may be arranged on the lower organic insulating layer LOIL. The first source electrode SE1, the first drain electrode DE1, the second source electrode SE2, or the second drain electrode DE2 may be connected to the data line DL or the driving voltage line directly or through another thin film transistor.

The upper organic insulating layer OIL may be disposed over the lower organic insulating layer LOIL. The upper organic insulating layer OIL may include a first organic insulating layer OIL1, a second organic insulating layer OIL2, and a third organic insulating layer OIL3. The first organic insulating layer OIL1, the second organic insulating layer OIL2, and the third organic insulating layer OIL3 may include organic materials.

At least one of the lower organic insulating layer LOIL, the first organic insulating layer OIL1, the second organic insulating layer OIL2, or the third organic insulating layer OIL3 may include organic insulating materials such as a general-purpose polymer such as polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, a p-xylene-based polymer, or a vinyl alcohol-based polymer, and a blend thereof. Alternatively, at least one of the lower organic insulating layer LOIL, the first organic insulating layer OIL1, the second organic insulating layer OIL2, or the third organic insulating layer OIL3 may include a siloxane-based organic material. The siloxane-based organic material may include hexamethyldisiloxane, octamethyltrisiloxane, decamethyltetrasiloxane, dodecamethylpentasiloxane, and polydimethylsiloxane.

An OLED may be arranged on the upper organic insulating layer OIL. Each of the first to fourth organic light-emitting diodes OLEDm, OLEDa, OLEDt1, and OLEDt2 may be electrically connected to each of the first to fourth pixel circuits PCm, PCa, PCt1, and PCt2. Each of the first to fourth organic light-emitting diodes OLEDm, OLEDa, OLEDt1, and OLEDt2 may include a pixel electrode 211, an emission layer 212, and a counter electrode 213.

The pixel electrode 211 may be arranged on the third organic insulating layer OIL3. The pixel electrode 211 may include a conductive oxide such as ITO, IZO, ZnO, $In_2O_3$, IGO, or AZO. The pixel electrode 211 may include a reflective layer including silver (Ag), magnesium (Mg), aluminum (Al), or a compound thereof. For example, the pixel electrode 211 may have a structure in which films including ITO, IZO, ZnO, or $In_2O_3$ are above/under the above-described reflective film. In this case, the pixel electrode 211 may have a stacked structure of ITO/Ag/ITO. The pixel electrode 211 may be directly connected to the first thin film transistor TFT1 through the connection electrode CM, or indirectly connected to the first thin film transistor TFT1 via another thin film transistor connected to the connection electrode CM.

As shown in FIG. 8, the pixel electrode 211 of the first organic light-emitting diode OLEDm in the first display area DA1 or the third organic light-emitting diode OLEDt1 in the first sub display area DA31 may be electrically connected to the connection electrode CM through a contact hole of the first organic insulating layer OIL1, the second organic insulating layer OIL2, and the third organic insulating layer OIL3. The first organic light-emitting diode OLEDm may be arranged to overlap the first pixel circuit PCm in the first display area DA1. Some of the third organic light-emitting diodes OLEDt1 may be arranged to overlap the third pixel circuit PCt1 in the first sub display area DA31. That is, the pixel electrode 211 of the first organic light-emitting diode OLEDm may overlap the first pixel circuit PCm, and the pixel electrode 211 of some of the third organic light-emitting diodes OLEDt1 may overlap the third pixel circuit PCt1.

Because the pixel area PCA in which the third pixel circuit PCt1 is arranged in the first sub display area DA31 has a reduced size in the y direction compared to that of the pixel area PCA in which the first pixel circuit PCm is arranged in the first display area DA1, as shown in FIG. 9, some of the third organic light-emitting diodes OLEDt1 may overlap the third pixel circuit PCt1 and the first bypass area FOA1 or the second bypass area FOA2 in the y direction. That is, the pixel electrode 211 of the third organic light-emitting diode OLEDt1 may overlap the third pixel circuit PCt1 and the first bypass area FOA1 or the second bypass area FOA2 in the y direction.

In the second display area DA2, the pixel electrode 211 of the second organic light-emitting diode OLEDa may be electrically connected to the connection electrode CM through the second connection line CWL. An end of the second connection line CWL may be connected to the second pixel circuit PCa, and the other end of the second connection line CWL may be connected to the pixel electrode 211 of the second organic light-emitting diode OLEDa. The second connection line CWL may be a lower connection line LCWL or an upper connection line UCWL. As illustrated in FIG. 10, the lower connection line LCWL may be arranged between the first organic insulating layer OIL1 and the second organic insulating layer OIL2. The lower connection line LCWL may be electrically connected to the connection electrode CM through a contact hole of the first organic insulating layer OIL1. The lower connection line LCWL may be electrically connected to the pixel electrode 211 of the second organic light-emitting diode OLEDa through a contact hole of the second organic insulating layer OIL2 and a contact hole of the third organic insulating layer OIL3. As illustrated in FIG. 11, the upper connection line UCWL may be arranged between the second organic insulating layer OIL2 and the third organic insulating layer OIL3. The upper connection line UCWL may be electrically connected to the connection electrode CM through the contact hole of the first organic insulating layer OIL1 and the contact hole of the second organic insulating layer OIL2. The upper connection line LCWL may be electrically connected to the second organic light-emitting diode OLEDa through the contact hole of the third organic insulating layer OIL3.

Because the second pixel circuit PCa is arranged in the second sub display area DA32, the second organic light-emitting diode OLEDa may be arranged to not overlap the second pixel circuit PCa in the second display area DA2. Some of the third organic light-emitting diodes OLEDt1 may be arranged to overlap the third pixel circuit PCt1 in the first sub display area DA31. That is, the pixel electrode 211 of the first organic light-emitting diode OLEDm may overlap the first pixel circuit PCm, and the pixel electrode 211 of some of the third organic light-emitting diodes OLEDt1 may overlap the third pixel circuit PCt1.

In some embodiments, an inorganic insulating layer IIL of the display panel 10 may be provided with a groove GV corresponding to the second display area DA2. For example, when the buffer layer 111, the first gate insulating layer 112, the second gate insulating layer 113, the first interlayer insulating layer 115, the second interlayer insulating layer 117, and the third interlayer insulating layer 119 are collectively referred to as the inorganic insulating layer IIL, the inorganic insulating layer IIL may have a groove GV or an opening corresponding to the second display area DA2.

The groove GV may have a shape in which a portion of the inorganic insulating layer IIL is removed. For example, as illustrated in FIGS. 8 to 12, the buffer layer 111, the first gate insulating layer 112, the second gate insulating layer 113, and the first interlayer insulating layer 115 may be continuously arranged in the first display area DA1, the second display area DA2, and the third display area DA3. As illustrated in FIGS. 10 and 11, the second interlayer insulating layer 117 and the third interlayer insulating layer 119 may each be provided with an opening that overlaps with the second display area DA2. The opening of the second interlayer insulating layer 117 and the opening of the third interlayer insulating layer 119 may each be formed through separate processes or may be formed simultaneously through the same process. When the opening of the second interlayer insulating layer 117 and the opening of the third interlayer insulating layer 119 are each formed by separate processes, the groove GV may have stepped portion such as a staircase shape. The lower organic insulating layer LOIL may fill the groove GV.

Although FIGS. 10 and 11 illustrate that openings are formed in the second interlayer insulating layer 117 and the third interlayer insulating layer 119, embodiments according to the present disclosure are not limited thereto. An opening may be formed in some of the buffer layer 111, the first gate insulating layer 112, the second gate insulating layer 113, and the first interlayer insulating layer 115, or the inorganic insulating layer IIL may not be provided with the groove GV.

As illustrated in FIG. 12, the fourth pixel circuit PCt2 and the fourth organic light-emitting diode OLEDt2 in the second sub display area DA32 may be electrically connected to each other by the connection electrode CM or the connection electrode CM and the first connection line TWL. The pixel electrodes 211 of some of the fourth organic light-emitting diodes OLEDt2 in the second sub display area DA32 may be electrically connected to the connection electrode CM through the contact hole of the first organic insulating layer OIL1, the second organic insulating layer OIL2, and the third organic insulating layer OIL3. In the second sub display area DA32, the pixel electrode 211 of some of the fourth organic light-emitting diodes OLEDt2 may be electrically connected to the connection electrode CM through the first connection line TWL. According to some embodiments, as illustrated in FIG. 12, the first connection line TWL may be arranged between the first organic insulating layer OIL1 and the second organic insulating layer OIL2, may be electrically connected to the connection electrode CM through the contact hole of the first organic insulating layer OIL1, and may be electrically connected to the pixel electrode 211 of the fourth organic light-emitting diode OLEDt2 through the contact hole of the second organic insulating layer OIL2 and the contact hole of the third organic insulating layer OIL3. According to some embodiments, the first connection line TWL may be arranged between the second organic insulating layer OIL2 and the third organic insulating layer OIL3, may be electrically connected to the connection electrode CM through the contact hole of the first organic insulating layer OIL1 and the contact hole of the second organic insulating layer OIL2, and may be electrically connected to the fourth organic light-emitting diode OLEDt2 through the contact hole of the third organic insulating layer OIL3. In the second sub display area DA32, the fourth organic light-emitting diode OLEDt2 of the fourth pixel Pt2 may overlap at least a portion of the fourth pixel circuit PCt2, or may not overlap the fourth pixel circuit PCt2 by being offset from the fourth pixel circuit PCt2.

The first connection line TWL and the second connection line CWL may be an opaque conductive line or a transparent conductive line. The opaque conductive line may include Mo, Al, Cu, Ti, etc., and may be a single layer or multilayer. For example, the transparent conductive line may include a transparent conducting oxide (TCO). For example, the transparent conductive line may include a conductive oxide such as ITO, IZO, ZnO, $In_2O_3$, IGO, or AZO. The first connection line TWL and the second connection line CWL may be formed through the same process as forming a conductive line arranged on the first display area DA1, or may be formed through a separate process.

A pixel defining layer 215 may be arranged on the organic insulating layer OIL. The pixel defining layer 215 may cover an edge of the pixel electrode 211, and may define a pixel by having an opening 2150P that exposes a portion of the pixel electrode 211. That is, the size and shape of an emission area may be defined by the opening 2150P of the pixel defining layer 215. The pixel defining layer 215 may include an organic insulating material such as polyimide, polyamide, acryl resin, benzocyclobutene (BCB), hexamethyldisiloxane (HMDSO), phenol resin, and the like, and may be formed by a method such as spin coating and the like. In some embodiments, the pixel defining layer 215 may include an insulating material (e.g., an organic insulating material)

including black dye or pigment, thereby preventing or reducing color mixing between adjacent pixels and thus improving visibility.

The emission layer 212 may include a low molecular weight material or a polymer material, and emit red, green, blue, or white light. A first common layer and/or a second common layer may be arranged under or above the emission layer 212, respectively. The first common layer that is an element arranged under the emission layer 212 may include, for example, a hole transport layer (HTL), or an HTL and a hole injection layer (HIL). The second common layer that is an element arranged on the emission layer 212 may include an electron transport layer (ETL) and/or an electron injection layer (EIL). According to some embodiments, the second common layer may not be provided.

The emission layer 212 may be arranged in each pixel to correspond to the opening 215OP of the pixel defining layer 215, whereas, like the counter electrode 213 to be described later, the first common layer and the second common layer each may be integrally formed to entirely cover the display area DA of the substrate 100.

The counter electrode 213 may be arranged on the emission layer 212. The counter electrode 213 may include a conductive material having a low work function. For example, the counter electrode 213 may include a (semi-)transparent layer including Ag, Mg, Al, platinum (Pt), lithium (Li), calcium (Ca), or an alloy thereof. Alternatively, the counter electrode 213 may further include a layer such as ITO, IZO, ZnO, or $In_2O_3$ on the (semi-)transparent layer including the above-described material. The counter electrode 213 may be integrally formed in a plurality of OLEDs to correspond to a plurality of pixel electrodes 211.

Figure 13:
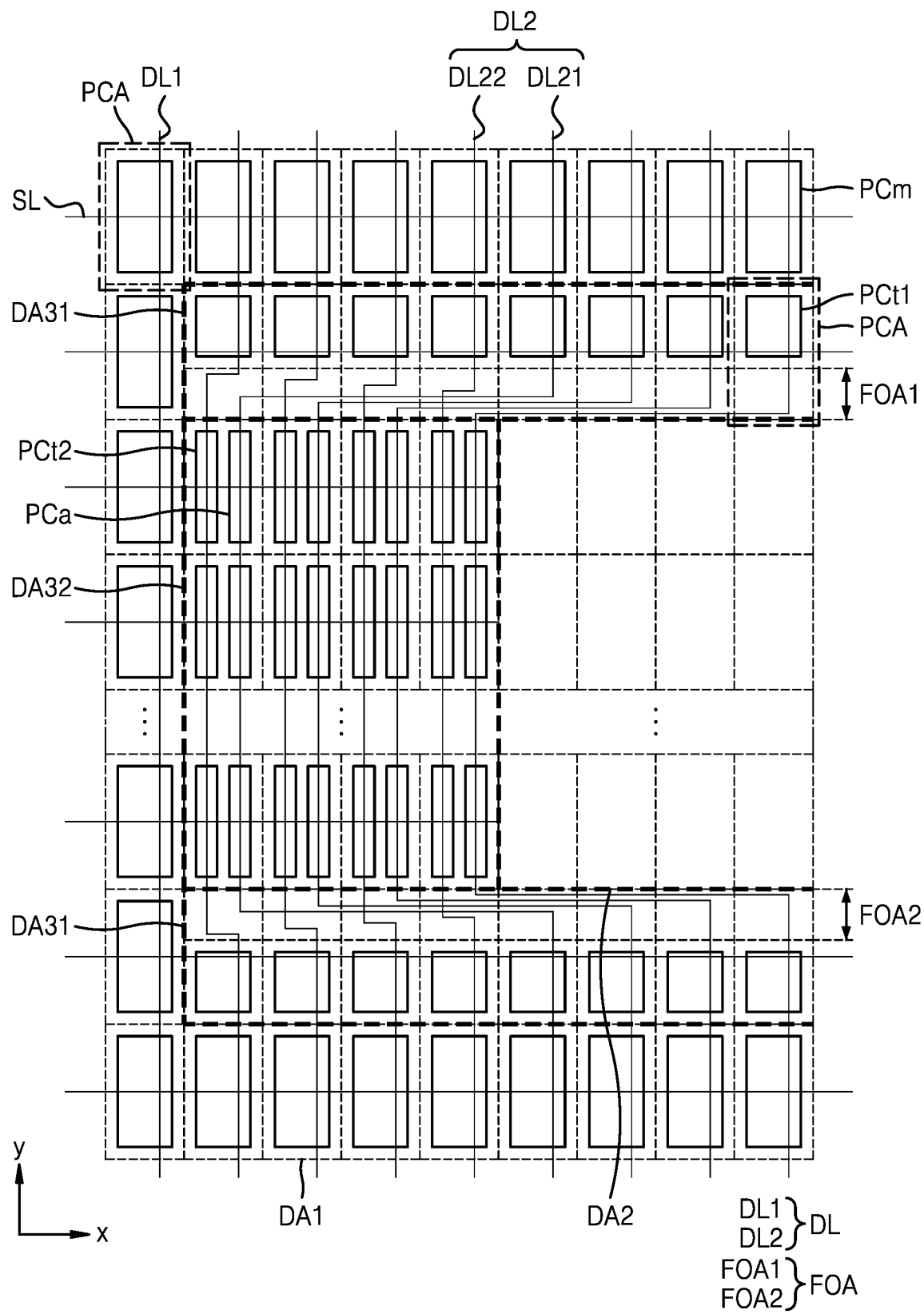
FIG. 13 is an enlarged view of region A of the display panel of FIG. 2, according to some embodiments.
Figure 14:
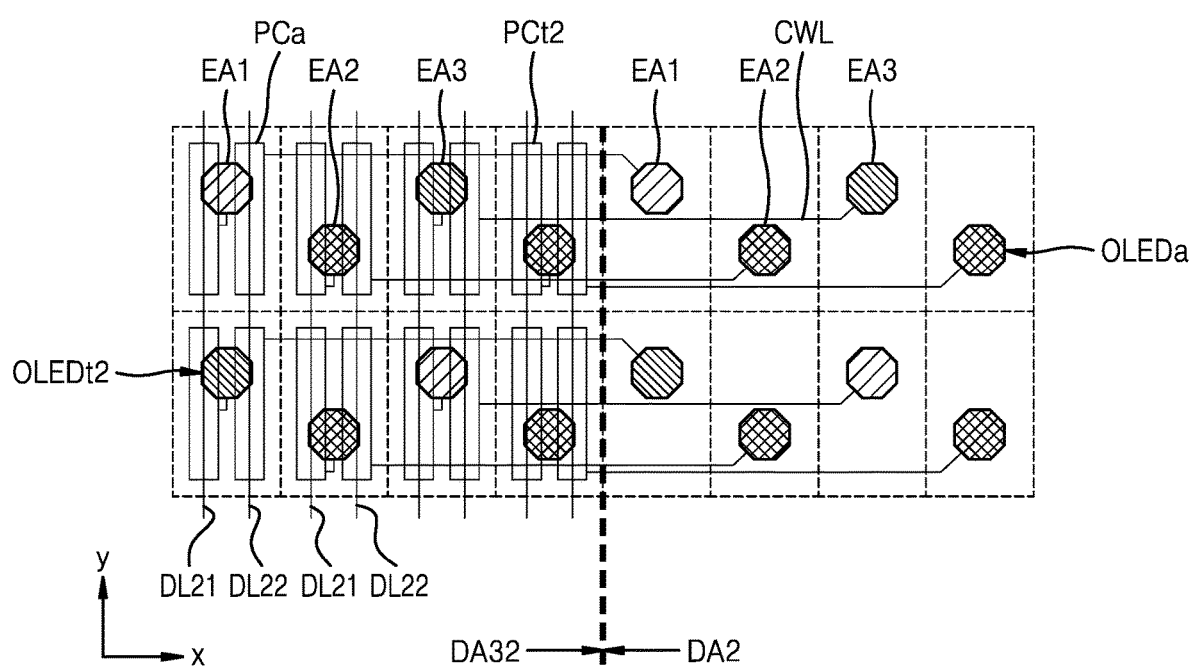
FIG. 14 is a diagram showing a connection between the pixel circuit and the display element in the second display area and the third display area of FIG. 13.

FIG. 13 is an enlarged view of the area A of the display panel 10 of FIG. 2, according to some embodiments. FIG. 14 is a diagram showing a connection between the pixel circuit and the display element in the second display area and the third display area of FIG. 13. Hereinafter, features that are different from that of FIGS. 6 and 7 are mainly described.

Referring to FIGS. 13 and 14, the fourth pixel circuit PCt2 and the fourth organic light-emitting diode OLEDt2 of the fourth pixel Pt2 may be arranged in the pixel area PCA of the second sub display area DA32 of the third display area DA3. The second pixel circuit PCa of the second pixel Pa may be arranged in the pixel area PCA of the second sub display area DA32. According to some embodiments, the fourth pixel circuit PCt2 of the fourth pixel Pt2 and the second pixel circuit PCa of the second pixel Pa may be arranged adjacently in the x direction in the pixel area PCA of the second sub display area DA32. According to some embodiments, the fourth pixel circuit PCt2 of the fourth pixel Pt2 and the second pixel circuit PCa of the second pixel Pa may be arranged adjacently in the y direction in the pixel area PCA of the second sub display area DA32.

As shown in FIG. 14, the second pixel circuit PCa of the second pixel Pa in the second sub display area DA32 may be electrically connected to the second organic light-emitting diode OLEDa of the second pixel Pa in the second display area DA2 through the second connection line CWL. The second connection line CWL may be the lower connection line LCWL illustrated in FIG. 10 or the upper connection line UCWL illustrated in FIG. 11. The second connection line CWL may be electrically connected to the second pixel circuit PCa by the connection electrode CM. The fourth pixel circuit PCt2 and the fourth organic light-emitting diode OLEDt2 of the fourth pixel Pt2 in the second sub display area DA32 may be electrically connected to each other by the connection electrode CM or the connection electrode CM and the first connection line TWL, as illustrated in FIG. 12.

The third data line DL21 and the fourth data line DL22 may be arranged alternately in the x direction in the second sub display area DA32. Some of the third data lines DL21 may cross some of the fourth data lines DL22 in the bypass area FOA. According to some embodiments, because portions of the third data lines crossing the fourth data lines are arranged on different layers from the fourth data lines, the third data lines DL21 and the fourth data lines DL22 may cross each other while being insulated from each other.

Figure 15:
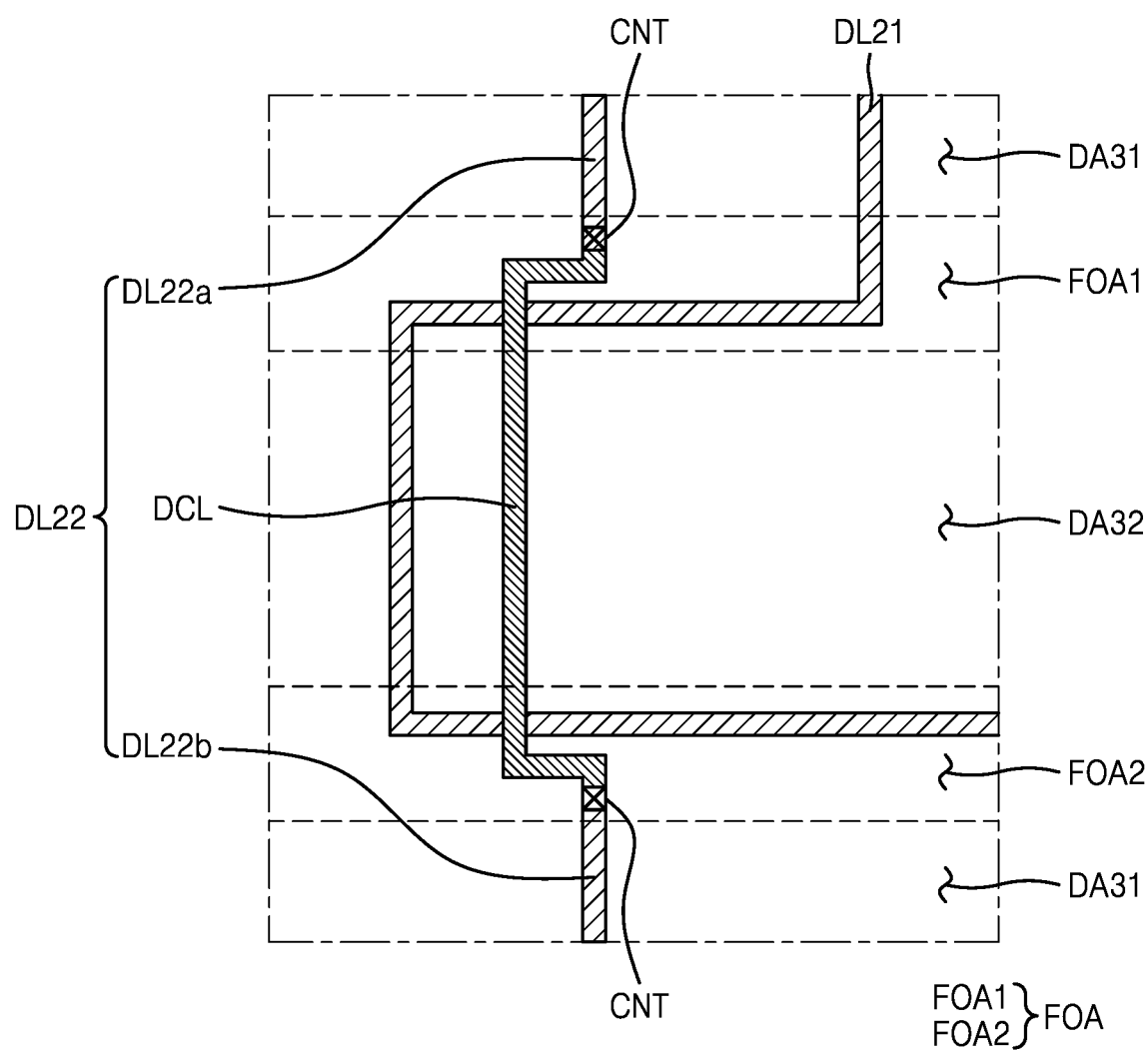
FIG. 15 is a diagram schematically illustrating a data line in the third display area according to some embodiments.
Figure 16:
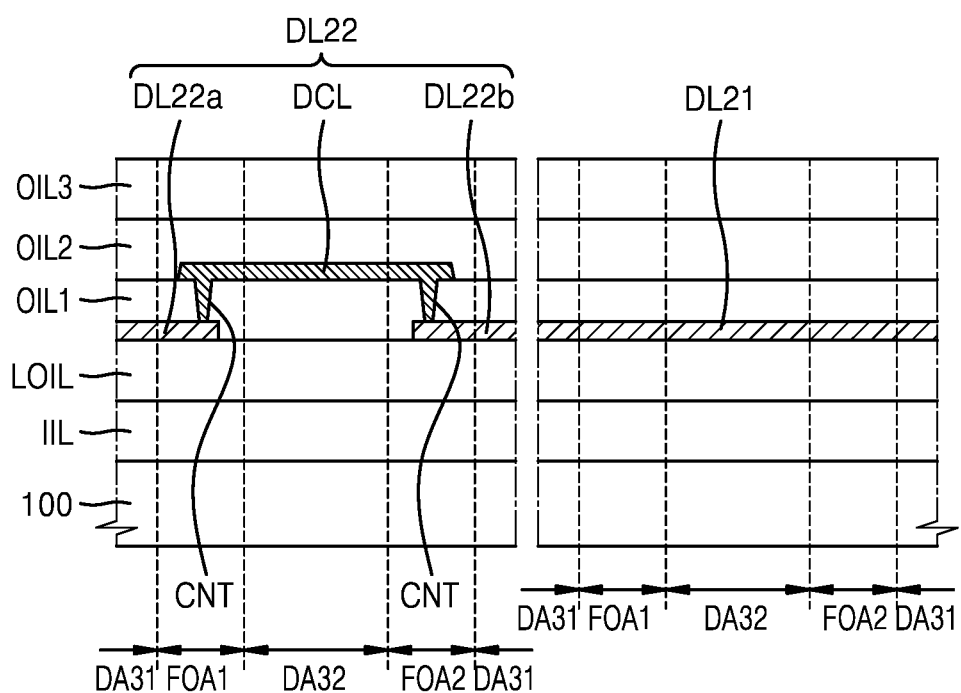
FIGS. 16 and 17 are cross-sectional views schematically illustrating an arrangement of the data lines of FIG. 15.
Figure 17:
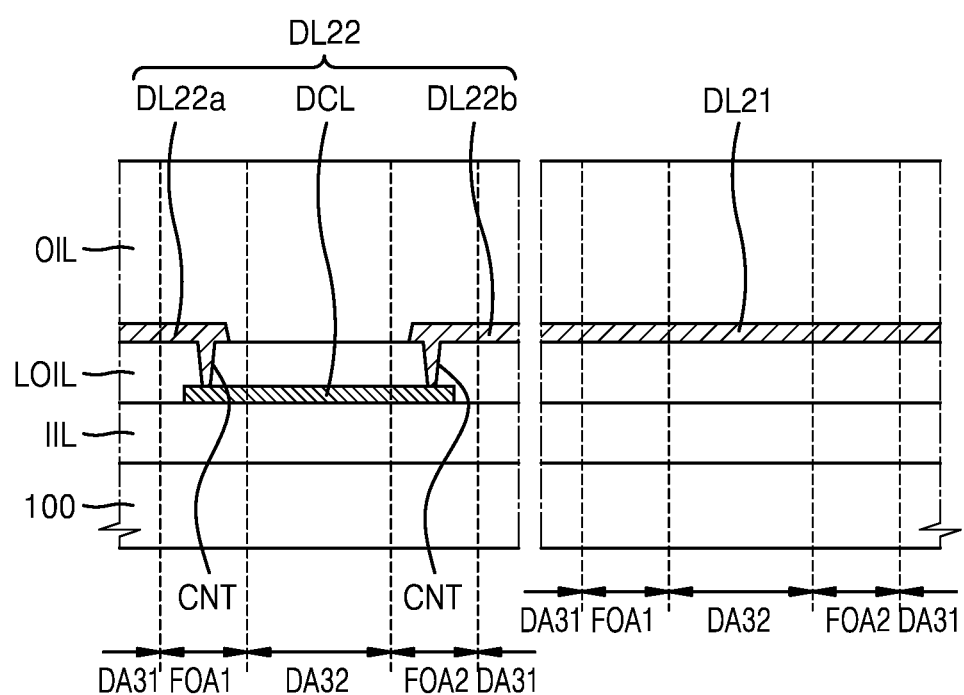

FIG. 15 is a diagram schematically illustrating the data line in the third display area according to some embodiments. FIGS. 16 and 17 are cross-sectional views schematically illustrating an arrangement of the data lines of FIG. 15.

Referring to FIG. 15, the third data line DL21 may cross the fourth data lines DL22 in the bypass area FOA. Each of the third data line DL21 and the fourth data line DL22 extending in the y direction from the first display area DA1 may change the extension direction to the x direction in the first bypass area FOA1 of the upper first sub display area DA31, change the extension direction again from the x direction to the y direction, and then extend in the y direction in the second sub display area DA32. The direction in which each of the third data line DL21 and the fourth data line DL22 extends may change from the y direction to the x direction in the second bypass area FOA2 of the lower first sub display area DA31 and then change from the x direction to the y direction. The third data line DL21 and the fourth data line DL22 may be arranged on different layers in the bypass area FOA and the second sub display area DA32. According to some embodiments, one of the third data line DL21 and the fourth data line DL22 may be disconnected in the bypass area FOA and connected by connection portions arranged in other layers. For example, the fourth data line DL22 may include a first portion DL22a extending in the y direction in the upper first display area DA1 and the upper first sub display area DA31, a second portion DL22b extending in the y direction in the lower first sub display area DA31 and the lower first display area DA1, and a connection portion DCL connecting the first portion DL22a and the second portion DL22b. The connection portion DCL of the fourth data line DL22 may be arranged in a different layer from the first portion DL22a and the second portion DL22b, and may be in contact with and thus be electrically connected to the first portion DL22a and the second portion DL22b through a contact hole CNT. Accordingly, the third data line DL21 and the fourth data line DL22 may cross each other while being insulated from each other in the bypass area FOA. The contact hole CNT may be arranged in the bypass area FOA.

According to some embodiments, as illustrated in FIG. 16, the third data line DL21 may be disposed on the lower organic insulating layer LOIL. The first portion DL22a and the second portion DL22b of the fourth data line DL22 may each be disposed on the lower organic insulating layer LOIL, and the connection portion DCL of the fourth data line DL22 may be arranged on the first organic insulating layer OIL1. The connection portion DCL of the fourth data line DL22 may be in contact with and thus be electrically connected to the first portion DL22a and the second portion DL22b through the contact hole CNT of the first organic insulating layer OIL1.

According to some embodiments, as illustrated in FIG. 17, the first portion DL22a and the second portion DL22b of the fourth data line DL22 may each be arranged on the lower organic insulating layer LOIL, and the connection portion DCL of the fourth data line DL22 may be arranged on the inorganic insulating layer K. The connection portion DCL of the fourth data line DL22 may be in contact with and thus be electrically connected to the first portion DL22a and the second portion DL22b through the contact hole CNT of the lower organic insulating layer LOIL.

Figure 18:
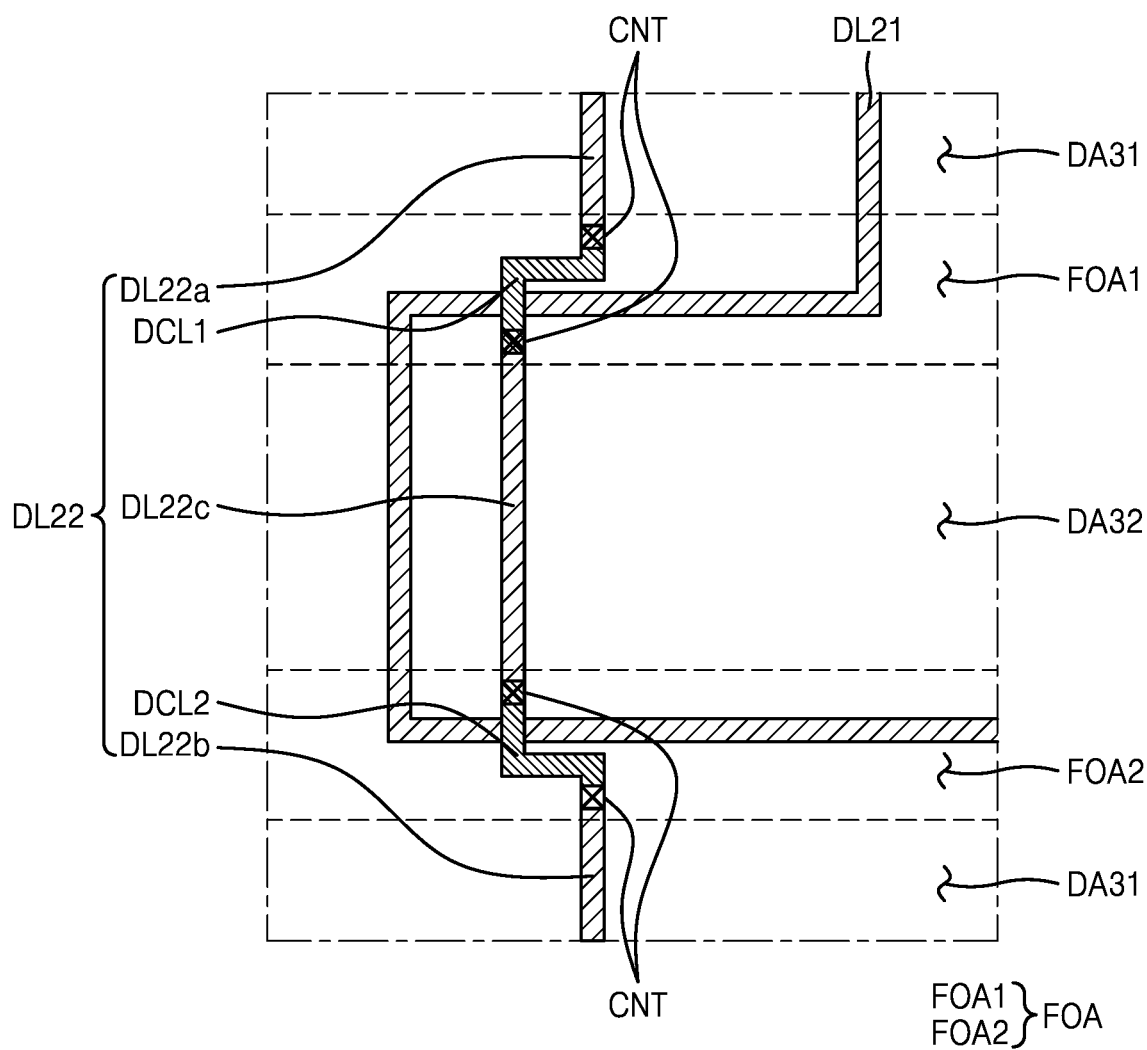
FIG. 18 is a diagram schematically illustrating a data line in a third display area according to some embodiments.
Figure 19:
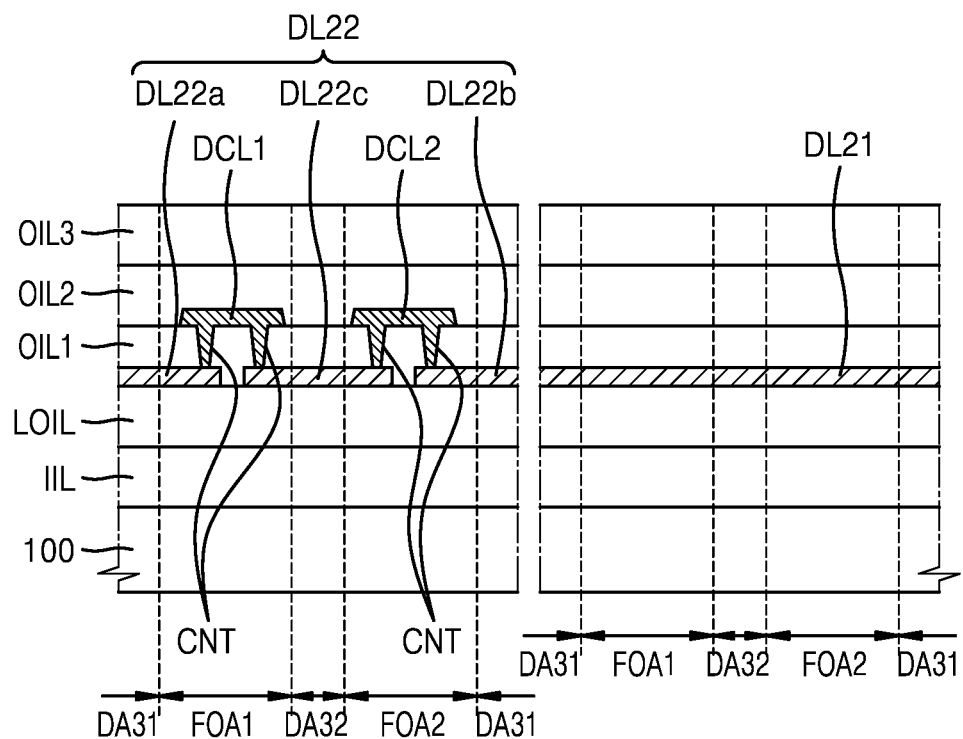
FIGS. 19 and 20 are cross-sectional views schematically illustrating an arrangement of the data lines of FIG. 18.
Figure 20:
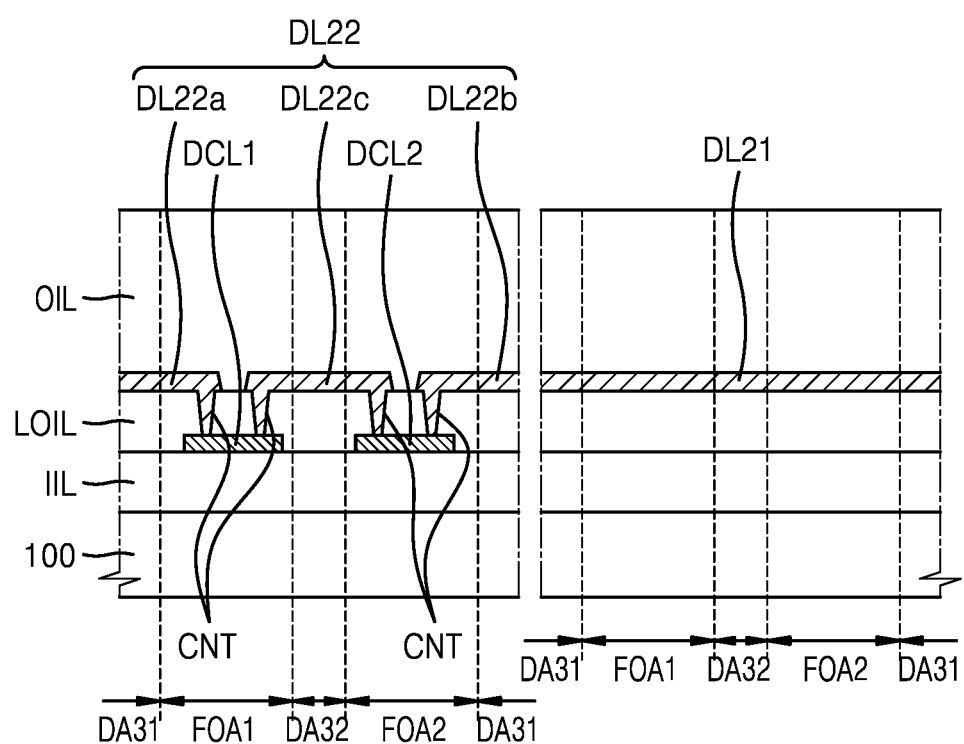

FIG. 18 is a diagram schematically illustrating a data line in a third display area according to some embodiments. FIGS. 19 and 20 are cross-sectional views schematically illustrating an arrangement of the data lines of FIG. 18.

Referring to FIG. 18, the third data line DL21 may cross the fourth data lines DL22 in the bypass area FOA. The direction in which the third data line DL21 and the fourth data line DL22 extending in the y direction from the first display area DA1 extends may change to the x direction in the first bypass area FOA1 and then change again from the x direction to the y direction in the first bypass area FOA1, and then extend in the y direction in the second sub display area DA32. The direction in which the third data line DL21 and the fourth data line DL22 extend may change from the y direction to the x direction in the second bypass area FOA2 and then change again from the x direction to the y direction. The third data line DL21 and the fourth data line DL22 may be arranged on different layers in the bypass area FOA. According to some embodiments, one of the third data line DL21 and the fourth data line DL22 may be disconnected in the bypass area FOA and connected by connection portions arranged in other layers. For example, the fourth data line DL22 may include a first portion DL22a extending in the y direction in the upper the first display area DA1 and the upper first sub display area DA31, a second portion DL22b extending in the y direction in the lower first sub display area DA31 and the lower first display area DA1, a third portion DL22c extending in the y direction in the second sub display area DA32, a first connection portion DCL1 connecting the first portion DL22 and the third portion DL22c, and a second connection portion DCL2 connecting the second portion DL22b and the third portion DL22c. The first connection portion DCL1 may be arranged in the first bypass area FOA1, and the second bypass area DCL2 may be arranged in the second bypass area FOA2. The first connection portion DCL1 and the second connection portion DCL2 of the fourth data line DL22 may be arranged in a different layer from the first portion DL22a, the second portion DL22b, and the third portion DL22c, and may be in contact with and thus be electrically connected to the first portion DL22a, the second portion DL22b, and the third portion DL22c through the contact hole CNT. Accordingly, the third data line DL21 and the fourth data line DL22 may cross each other while being insulated from each other in the bypass area FOA. The contact hole CNT may be arranged in the bypass area FOA.

According to some embodiments, as illustrated in FIG. 19, the third data line DL21 may be disposed on the lower organic insulating layer LOIL. The first portion DL22a, the second portion DL22b, and the third portion DL22c of the fourth data line DL22 may each be disposed on the lower organic insulating layer LOIL, and the first connection portion DCL1 and the second connection portion DCL2 of the fourth data line DL22 may be arranged on the first organic insulating layer OIL1. The first connection portion DCL1 and the second connection portion DCL2 of the fourth data line DL22 may be in contact with and thus be electrically connected to the first portion DL22a, the second portion DL22b, and the third portion DL22c through the contact hole CNT of the first organic insulating layer OIL1.

According to some embodiments, as illustrated in FIG. 20, the first portion DL22a, the second portion DL22b, and the third portion DL22c of the fourth data line DL22 may each be arranged on the lower organic insulating layer LOIL, and the first connection portion DCL1 and the second connection portion DCL2 of the fourth data line DL22 may be arranged on the inorganic insulating layer K. The first connection portion DCL1 and the second connection portion DCL2 of the fourth data line DL22 may be in contact with and thus be electrically connected to the first portion DL22a, the second portion DL22b, and the third portion DL22c through the contact holes CNT of the lower organic insulating layer LOIL.

In the embodiments illustrated in FIGS. 15 to 20, the third data line DL21 may be formed as a conductive line, and the fourth data line DL22 may be formed as a conductive line in which portions of the fourth data line DL22 arranged in different areas are electrically connected through the connection portion. Embodiments according to the present disclosure are not limited thereto. For example, the fourth data line DL22 may be formed as a conductive line and the third data line DL21 may be formed as a conductive line in which portions of the third data line DL21 arranged in different areas are electrically connected through one or at least one connection portion.

Although a pair of pixel circuits are illustrated to be arranged in each pixel area PCA in the second sub display area DA32 of the third display area DA3 in the embodiments described above, embodiments of the disclosure are not limited thereto. According to the resolution of the second display area DA2 and/or the third display area DA3, one pixel circuit or three or more pixel circuits may be arranged in the pixel area PCA. According to the number of pixel circuits arranged in each pixel area PCA, the size of each pixel circuit may become different. The size of the pixel circuit may be adjusted by adjusting the line width of devices constituting the pixel circuit and/or changing the arrangement of the devices.

In the embodiments described above, the pixels of the first display area DA1, the second display area DA2, and the third display area DA3 are arranged in a PenTile™ structure. Embodiments according to the present disclosure are not limited thereto. For example, the pixels of the first display area DA1, the second display area DA2, and the third display area DA3 may be arranged in various pixel arrangement structures such as a stripe structure, a delta structure, and the like. In addition, the pixel arrangement structure of at least one of the first display area DA1, the second display area DA2, or the third display area DA3 may be different.

The disclosure has been described with reference to the embodiments illustrated in the drawings, but these descriptions are merely examples and it will be understood by those of ordinary skill in the art that various changes in forms and details may be made therein without departing from the spirit and scope of embodiments defined by the following claims.

In a display panel and a display apparatus according to some embodiments, a pixel circuit may not be arranged in a display area in which components are arranged, and thus, a larger transmissive area may be ensured to improve transmittance.

A display panel and a display apparatus according to the embodiments may be provided with a bypass area around a display area in which components are arranged, thereby allowing data lines to bypass and thus making it unnecessary to use a separate conductive line to connect the data lines around the display area in which components are arranged.

Accordingly, the display panel and the display apparatus according to the embodiments may have relatively improved yield and may simplify the manufacturing process by reducing the number of masks.

However, the scope of embodiments according to the present disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:
a substrate comprising a first display area in which a plurality of first display elements are disposed, a second display area in which a plurality of second display elements are disposed, and a third display area between the first display area and the second display area;
a plurality of first pixel circuits in the first display area and connected to the plurality of first display elements;
a plurality of second pixel circuits in the third display area and connected to the plurality of second display elements; and
a plurality of first data lines connected to the plurality of first pixel circuits of the first display area and the plurality of second pixel circuits of the third display area, wherein
the third display area comprises a first sub display area adjacent to the second display area in a first direction, and a second sub display area adjacent to the second display area in a second direction,
the first sub display area comprises a bypass area, and
the plurality of first data lines pass across the first sub display area and the second sub display area, and an extension direction thereof changes in the bypass area.

2. The display panel of claim 1, wherein the bypass area extends along the first sub display area in the second direction, and is adjacent to the second sub display area and the second display area.

3. The display panel of claim 1, further comprising:
a plurality of third display elements and a plurality of third pixel circuits connected to the plurality of third display elements, arranged in the first sub display area of the third display area;
a plurality of fourth display elements and a plurality of fourth pixel circuits connected to the plurality of fourth display elements, arranged in the second sub display area of the third display area; and
a plurality of second data lines connected to the first pixel circuits of the first display area and the fourth pixel circuits of the second sub display area, and of which an extension direction changes in the bypass area of the first sub display area.

4. The display panel of claim 3, wherein each of the first data lines and the second data lines is connected to the first pixel circuits and the third pixel circuits of the first sub display area, arranged in a same column.

5. The display panel of claim 3, wherein a size of the third pixel circuits in the first direction is less than a size of the first pixel circuits in the first direction.

6. The display panel of claim 5, wherein each of the third display elements overlaps a portion of each of the third pixel circuits to which the third display element is connected and a portion of the bypass area.

7. The display panel of claim 6, wherein one of the first data line and the second data line crossing each other in the bypass area comprises a first portion in the first sub display area and a second portion in the second sub display area, and the first portion is electrically connected to the second portion in the bypass area.

8. The display panel of claim 3, wherein at least one of the first data lines and at least one of the second data lines cross each other in the bypass area.

9. The display panel of claim 8, wherein a portion of each of the first data lines and a portion of each of the second data lines that cross each other in the bypass area are on different layers from each other.

10. The display panel of claim 9, wherein, regarding one of the first data line and the second data line crossing each other in the bypass area, a portion in the first sub display area and a portion in the second sub display area are electrically connected to each other.

11. The display panel of claim 9, wherein one of the first data line and the second data line crossing each other in the bypass area comprises a first portion in the first sub display area, a second portion in the second sub display area, and a third portion arranged in the bypass area and connecting the first portion and the second portion.

12. A display panel comprising:
a substrate comprising a first display area in which a plurality of first display elements are disposed, a second display area in which a plurality of second display elements are disposed, and a third display area between the first display area and the second display area;
a plurality of first pixel circuits in the first display area and connected to the plurality of first display elements;
a plurality of second pixel circuits in the third display area and connected to the plurality of second display elements; and
a plurality of first data lines connected to the plurality of first pixel circuits of the first display area and the plurality of second pixel circuits of the third display area, wherein
the third display area comprises a pair of first sub display areas spaced apart from each other in a first direction with the second display area therebetween, and a pair of second sub display areas spaced apart from each other in a second direction with the second display area therebetween,
each of the pair of first sub display areas comprises a bypass area, and
the first data lines pass across one of the first sub display areas and the second sub display areas, and an extension direction thereof changes in the bypass area.

13. The display panel of claim 12, further comprising:
a plurality of third display elements and a plurality of third pixel circuits connected to the third display elements, in the first sub display areas of the third display area;
a plurality of fourth display elements and a plurality of fourth pixel circuits connected to the fourth display elements, in the second sub display areas of the third display area; and
a plurality of second data lines which are connected to the first pixel circuits of the first display area and the fourth pixel circuits of each of the second sub display areas, and of which an extension direction changes in the bypass area of each of the first sub display areas, wherein each of the first data lines and the second data lines are connected to the first pixel circuits and the third pixel circuits of the first sub display area, in a same column.

14. The display panel of claim 13, wherein a size of the third pixel circuits in the first direction is less than a size of the first pixel circuits in the first direction.

15. The display panel of claim 13, wherein at least one of the first data lines and at least one of the second data lines cross each other in the bypass area.

16. The display panel of claim 13, wherein a portion of each of the first data lines and a portion of each of the second data lines, which cross each other in the bypass area, are on different layers from each other.

17. The display panel of claim 13, wherein one of the first data line and the second data line crossing each other in the bypass area comprises a first portion and a second portion in each of the pair of first sub display areas, and a connection portion in the second sub display area, and the first portion and the second portion are electrically connected to each other by the connection portion in the bypass area.

18. The display panel of claim 13, wherein one of the first data line and the second data line crossing each other in the bypass area comprises a first portion and a second portion in each of the pair of first sub display areas, a third portion in the second sub display area, and a first connection portion and a second connection portion in the bypass area of each of the pair of first sub display areas, and the first connection portion electrically connects the first portion to the third portion, and the second connection portion electrically connects the second portion to the third portion.

19. A display apparatus comprising:

a display panel comprising a first display area having a plurality of first display elements, a second display area having a plurality of second display elements, and a third display area between the first display area and the second display area;

a component corresponding to the second display area under the display panel, wherein the display panel further comprises:

a plurality of first pixel circuits in the first display area and connected to the first display elements;

a plurality of second pixel circuits in the third display area and connected to the second display elements; and a plurality of first data lines connected to the first pixel circuits of the first display area and the second pixel circuits of the third display area, wherein the third display area comprises a pair of first sub display areas spaced apart from each other in a first direction with the second display area therebetween, and a pair of second sub display areas spaced apart from each other in a second direction with the second display area therebetween, each of the pair of the first sub display area comprises a bypass area, and the first data lines pass across one of the first sub display areas and the second sub display areas, and an extension direction thereof changes in the bypass area.

20. The display apparatus of claim 19, wherein a size of the third pixel circuits in the first direction is less than a size of the first pixel circuits in the first direction.

21. The display apparatus of claim 19, wherein at least one of the first data lines and at least one of second data lines cross each other in the bypass area, one of the first data line and the at least one of the second data lines crossing each other in the bypass area comprises a first portion and a second portion in the pair of first sub display areas, and a connection portion in the second sub display area, and the first portion and the second portion are electrically connected to each other by the connection portion in the bypass area.

22. The display apparatus of claim 19, wherein at least one of the first data lines and at least one of second data lines cross each other in the bypass area, one of the first data line and the at least one of the second data lines crossing each other in the bypass area comprises a first portion and a second portion in each of the pair of first sub display areas, a third portion in the second sub display area, and a first connection portion and a second connection portion in the bypass area of each of the pair of first sub display areas, and the first connection portion electrically connects the first portion to the third portion, and the second connection portion electrically connects the second portion to the third portion.

* * * * *